US008325857B2

(12) United States Patent \
Jia et al.

(10) Patent No.: US 8,325,857 B2 \
(45) Date of Patent: *Dec. 4, 2012

(54) MODULATION DIVISION MULTIPLE ACCESS

(75) Inventors: Ming Jia, Ottawa (CA); Jianglei Ma, Kanata (CA); Peiying Zhu, Kanata (CA); Wen Tong, Ottawa (CA); Curt Dodd, Ottawa (CA)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/349,169

(22) Filed: Jan. 12, 2012

(65) Prior Publication Data

US 2012/0106410 A1    May 3, 2012

Related U.S. Application Data

(63) Continuation of application No. 11/942,492, filed on Nov. 19, 2007, now Pat. No. 8,116,412.

(60) Provisional application No. 60/882,921, filed on Dec. 30, 2006.

(51) Int. Cl.
*H03D 1/00* (2006.01)

(52) U.S. Cl. ........ 375/343; 375/220; 375/264; 375/260; 375/324; 375/349; 370/297; 370/473; 370/469; 370/441; 370/442; 455/103; 455/500

(58) Field of Classification Search .................. 370/297, 370/473, 469, 441, 442; 375/220, 264, 260, 375/324, 349, 343; 455/103, 500

See application file for complete search history.

(56) References Cited

U.S. PATENT DOCUMENTS 5,966,412 A    10/1999  Ramaswamy
7,593,697 B2    9/2009  Zhu et al.
7,630,451 B2   12/2009  Collins et al.
7,894,401 B2 *  2/2011  Von Elbwart et al. ........ 370/335
7,986,746 B2    7/2011  Steer
2005/0120097 A1 *  6/2005  Walton et al. ................. 709/220
2006/0171283 A1    8/2006  Vijayan et al.
2006/0198454 A1 *  9/2006  Chung et al. .................. 375/260

(Continued)

OTHER PUBLICATIONS

Naguib, A.F., et al., "Applications of space-time block codes and interference suppression for high capacity and high data rate wireless systems," Thirty-Second Asilomar Conference on Signals, Systems and Computers, vol. 2, 1998, pp. 1803-1810.

(Continued)

*Primary Examiner* — David Ometz \
*Assistant Examiner* — Rahel Guarino \
(74) *Attorney, Agent, or Firm* — Meyertons, Hood, Kivlin, Kowert & Goetzel, P.C.

(57) ABSTRACT

The present invention employs hierarchical modulation to simultaneously transmit information on different modulation layers using a carrier RF signal. Initially, first data to be transmitted is assigned to a first modulation layer and second data is assigned to a second modulation layer. In one embodiment of the present invention, the first and second data are assigned based on reliability criteria. The first and second modulation layers are hierarchical modulation layers of the carrier RF signal. Once assigned, the first data is transmitted using the first modulation layer of the carrier RF signal and the second data is transmitted using the second modulation layer of the carrier RF signal. In one embodiment of the present invention, information may be transmitted to one end user using one modulation layer, and information may be transmitted to a different end user using a different modulation layer.

31 Claims, 19 Drawing Sheets

U.S. PATENT DOCUMENTS

2006/0280262 A1* 12/2006 Malladi .................. 375/299
2007/0147539 A1*  6/2007 Gorokhov et al. ............ 375/295
2008/0025241 A1*  1/2008 Bhushan et al. ............. 370/312
2011/0002430 A1*  1/2011 Kim et al. .................... 375/362

OTHER PUBLICATIONS

Non-Final Rejection mailed Jan. 6, 2010 for U.S. Appl. No. 11/618,774, 10 pages.
Final Rejection mailed Aug. 24, 2010 for U.S. Appl. No. 11/618,774, 16 pages.
Notice of Allowance mailed Mar. 17, 2011 for U.S. Appl. No. 11/618,774, 11 pages.
Non-Final Rejection mailed Jan. 28, 2010 for U.S. Appl. No. 11/945,162, 10 pages.
Final Rejection mailed Oct. 12, 2010 for U.S. Appl. No. 11/945,162, 6 pages.
Notice of Allowance mailed Apr. 8, 2011 for U.S. Appl. No. 11/945,162, 11 pages.
Non-Final Rejection mailed Sep. 14, 2010 for U.S. Appl. No. 11/942,492, 17 pages.
Non-Final Rejection mailed Apr. 15, 2011 for U.S. Appl. No. 11/942,492, 25 pages.
Notice of Allowance mailed Oct. 7, 2011 for U.S. Appl. No. 11/942,492, 7 pages.
Non-Final Rejection mailed Oct. 4, 2011 for U.S. Appl. No. 13/183,112, 4 pages.
Non-final Office Action for U.S. Appl. No. 13/210,623 mailed Jan. 5, 2012, 6 pages.

* cited by examiner

MODULATION DIVISION MULTIPLE ACCESS

RELATED APPLICATIONS

This application is a continuation application of U.S. patent application Ser. No. 11/942,492, filed Nov. 19, 2007, which claims the benefit of U.S. provisional patent application Ser. No. 60/882,921, filed Dec. 30, 2006, the disclosures of which are hereby incorporated by reference in their entireties.

This application is also related to U.S. patent application Ser. No. 11/618,774 entitled CONTENT DIFFERENTIATED HIERARCHICAL MODULATION USED IN RADIO FREQUENCY COMMUNICATIONS by Steer et al, filed Dec. 30, 2006, which is hereby incorporated by reference in its entirety.

FIELD OF THE INVENTION

The present invention relates to radio frequency (RF) transmitter modulation techniques used in RF communications systems.

BACKGROUND OF THE INVENTION

With each successive generation of RF communications systems, modulation techniques, access schemes, and communications protocols become more sophisticated and demanding. One universal goal is to increase the amount of information transmitted in a given communications band, and to accommodate different types of information that must be communicated. For example, first generation cellular networks were designed to provide only voice services; however, these networks have evolved to provide a number of simultaneous services, including internet traffic, such as emails, and provide multi-media services, such as broadcast and on demand services in specific geographic areas. Each of these services may have its own specific requirements for bandwidth, latency, acceptable error rate, and locations of availability. As a result, different processing methods have been developed, including orthogonal frequency division multiplexing (OFDM), single carrier frequency division multiplexing (SC-FDM), single frequency networks (SFN), multiple input multiple output (MIMO), and multi-hop and relayed transmissions. OFDM and SC-FDM can distribute a high bandwidth signal onto multiple sub-carriers of lower bandwidth. SFNs improve signal coverage of broadcast data by transmitting the same information at the same time from multiple antennas. MIMO adds antennas to a system to provide spatial multiplexing, diversity, or both. Multi-hop and relayed transmissions provide broadcast data to multiple base stations. Therefore, as communications systems evolve, there is a need to increase the number and diversity of services by improving how bandwidth is utilized.

SUMMARY OF THE INVENTION

The present invention employs hierarchical modulation to simultaneously transmit information on different modulation layers using a carrier RF signal. Initially, first data to be transmitted is assigned to a first modulation layer and second data is assigned to a second modulation layer. In one embodiment of the present invention, the first and second data are assigned based on reliability criteria. The first and second modulation layers are hierarchical modulation layers of the carrier RF signal. Once assigned, the first data is transmitted using the first modulation layer of the carrier RE signal and the second data is transmitted using the second modulation layer of the carrier RE signal. One modulation layer is generally a higher order than the other modulation layer. In one embodiment of the present invention, information may be transmitted to one end user using one modulation layer, and information may be transmitted to a different end user using a different modulation layer.

All things being equal, the lower order modulation layer is generally more reliable than the higher order modulation layer. In general, the reliability criteria takes the reliability characteristics of the different modulation layers into account when assigning the first and second data to the different modulation layers. For example, reliability information may be derived from signal strength measurements or channel conditions to determine an appropriate modulation to use for transmitting certain data. Alternatively, different data may be associated with different transmission priorities. Entertainment channels may have a lower priority than emergency service channels. Although maintaining data integrity is important for file transfers, the relative transmission priority for a file transfer is generally much lower than that for voice or other streaming media. In essence, the reliability criteria may relate to the communication channels, the transmission of the data, or both. An example of reliability criteria related to transmission of the data is data that cannot be re-transmitted requires higher reliability than data that can be re-transmitted. For the various data, the reliability information is used to assign the various data to the different modulation layers for transmission.

In certain embodiments of the present invention, different data is broadcast to multiple users using different modulation layers. The different data may be assigned to specific modulation layers based on reliability criteria. In one embodiment of the present invention, a single program is broken into two different data streams.

In voice applications, each modulation layer may support one or more voice calls. As such, the reliability criteria may be used when assigning data for different voice calls to the different modulation layers. Some calls are supported on higher order modulation layers while others are supported on lower order modulation layers in light of the reliability criteria.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 1:
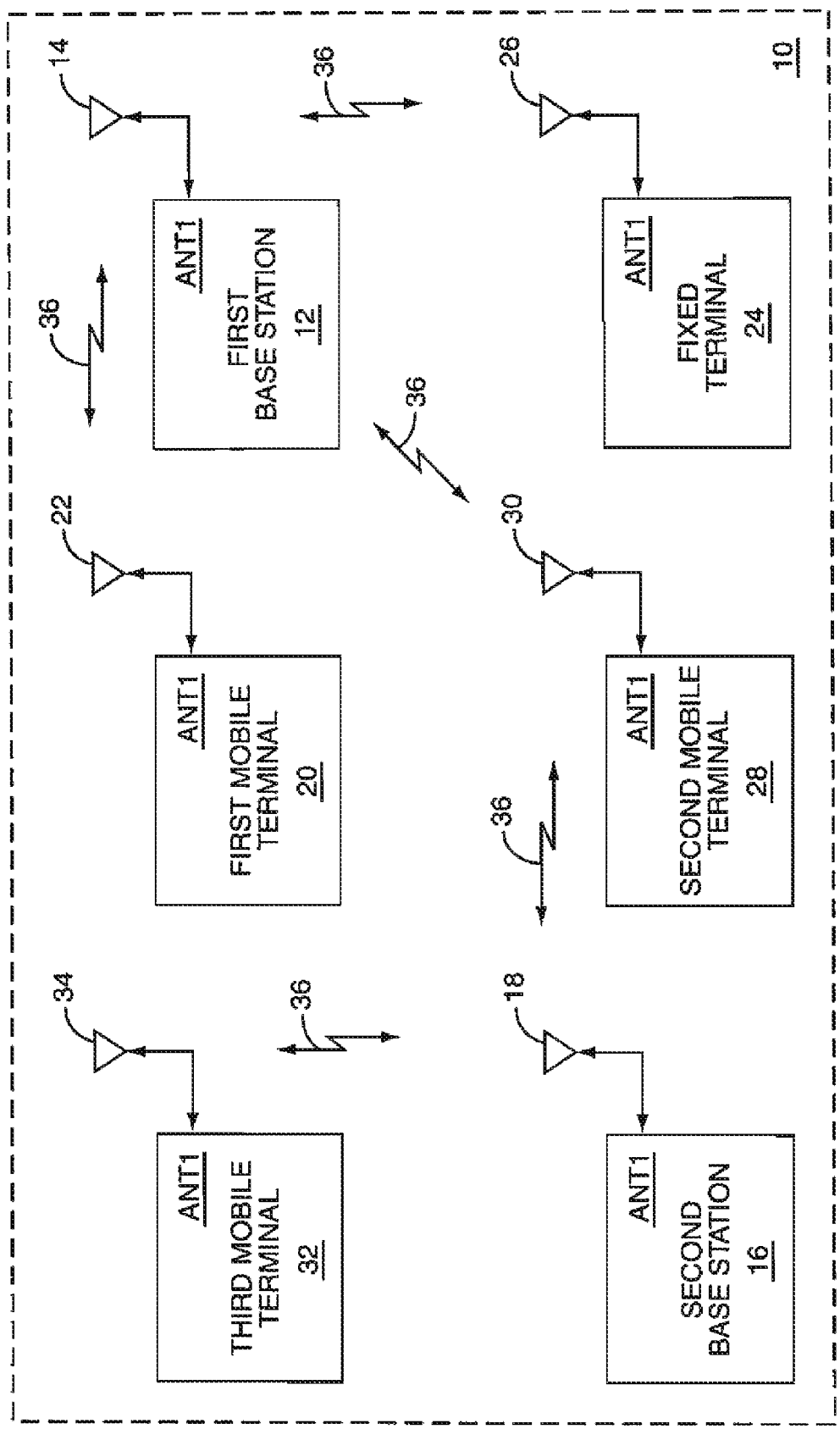
FIG. 1 shows an RF communications system.
Figure 9:
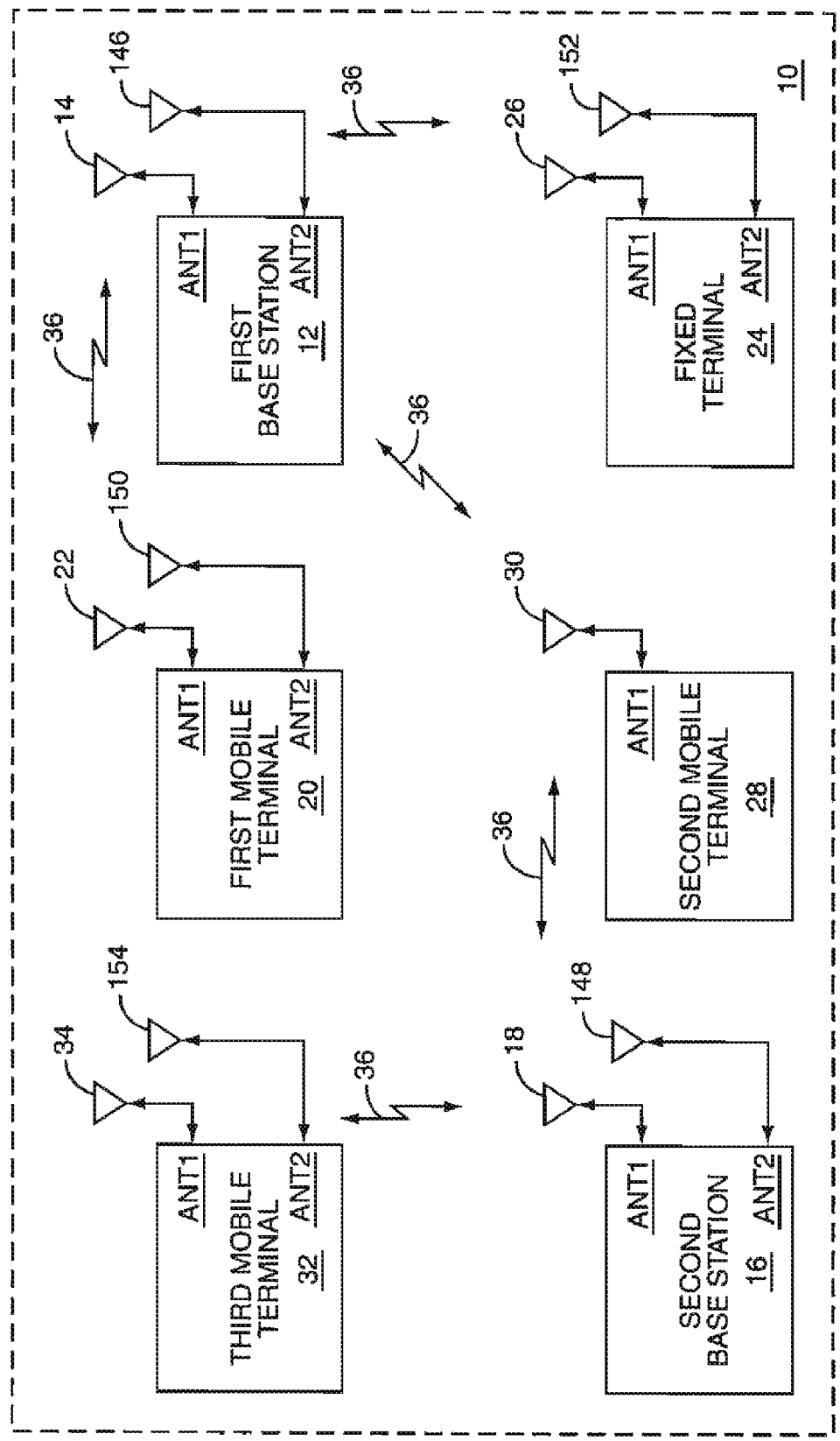

FIG. 9 adds MIMO antennas to the base stations and some of the terminals illustrated in FIG. 1.

Figure 10:
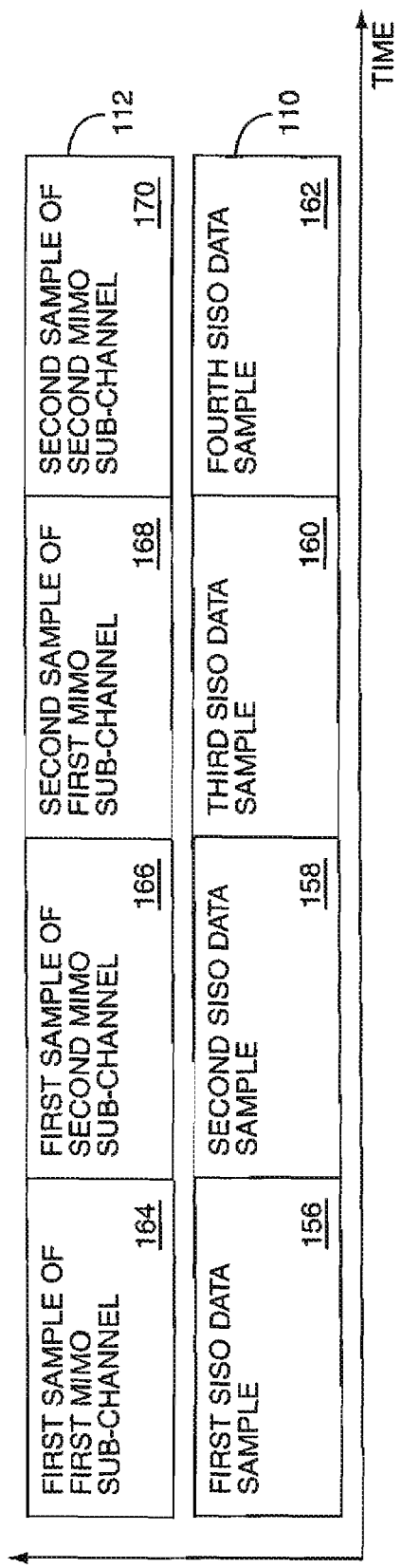

FIG. 10 shows single input single output (SISO) data included in the lower modulation layer data, and two MIMO sub-channels included in the higher modulation layer data.

Figure 11:
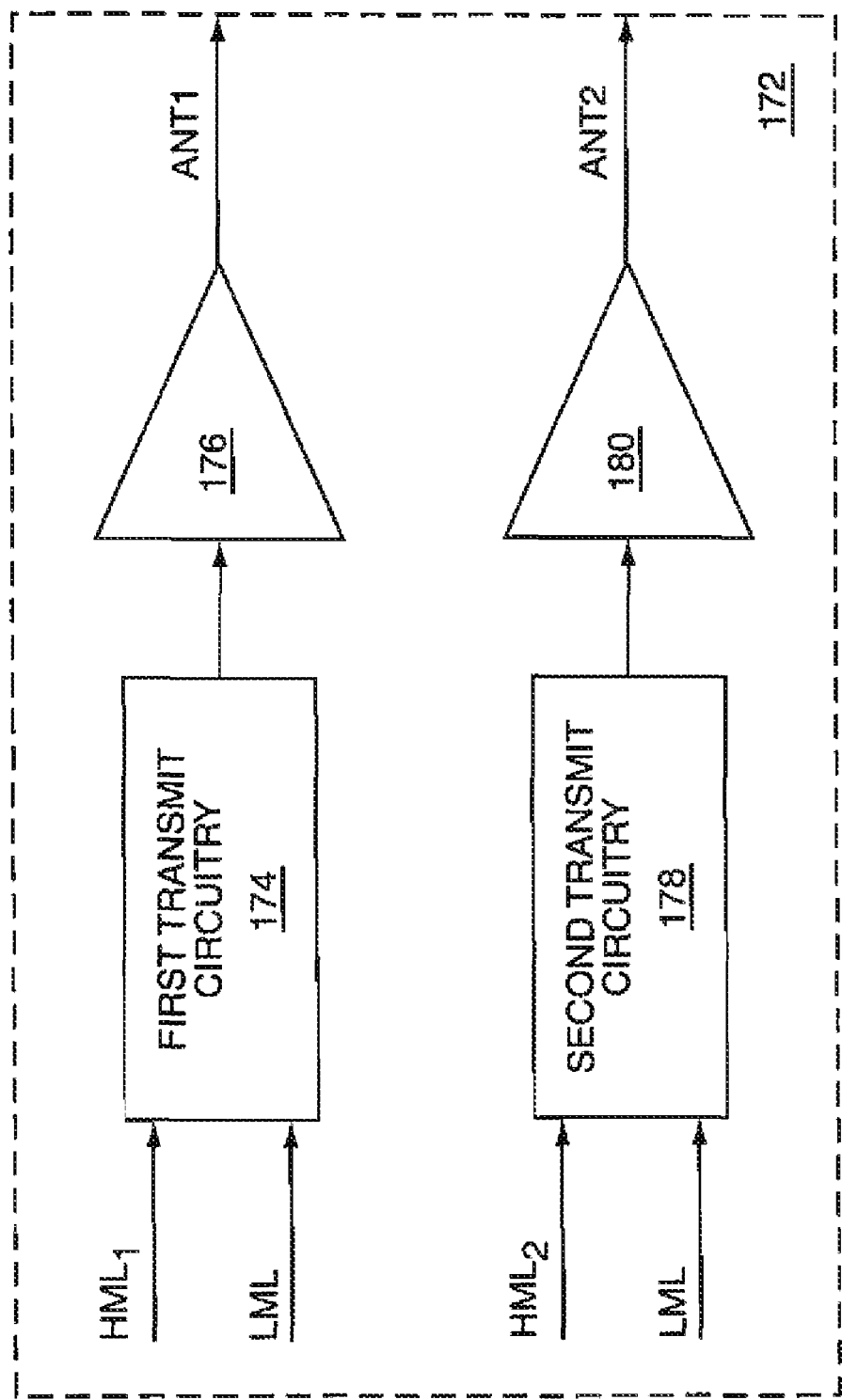

FIG. 11 shows the present invention used with MIMO transmitter circuitry.

Figure 12:
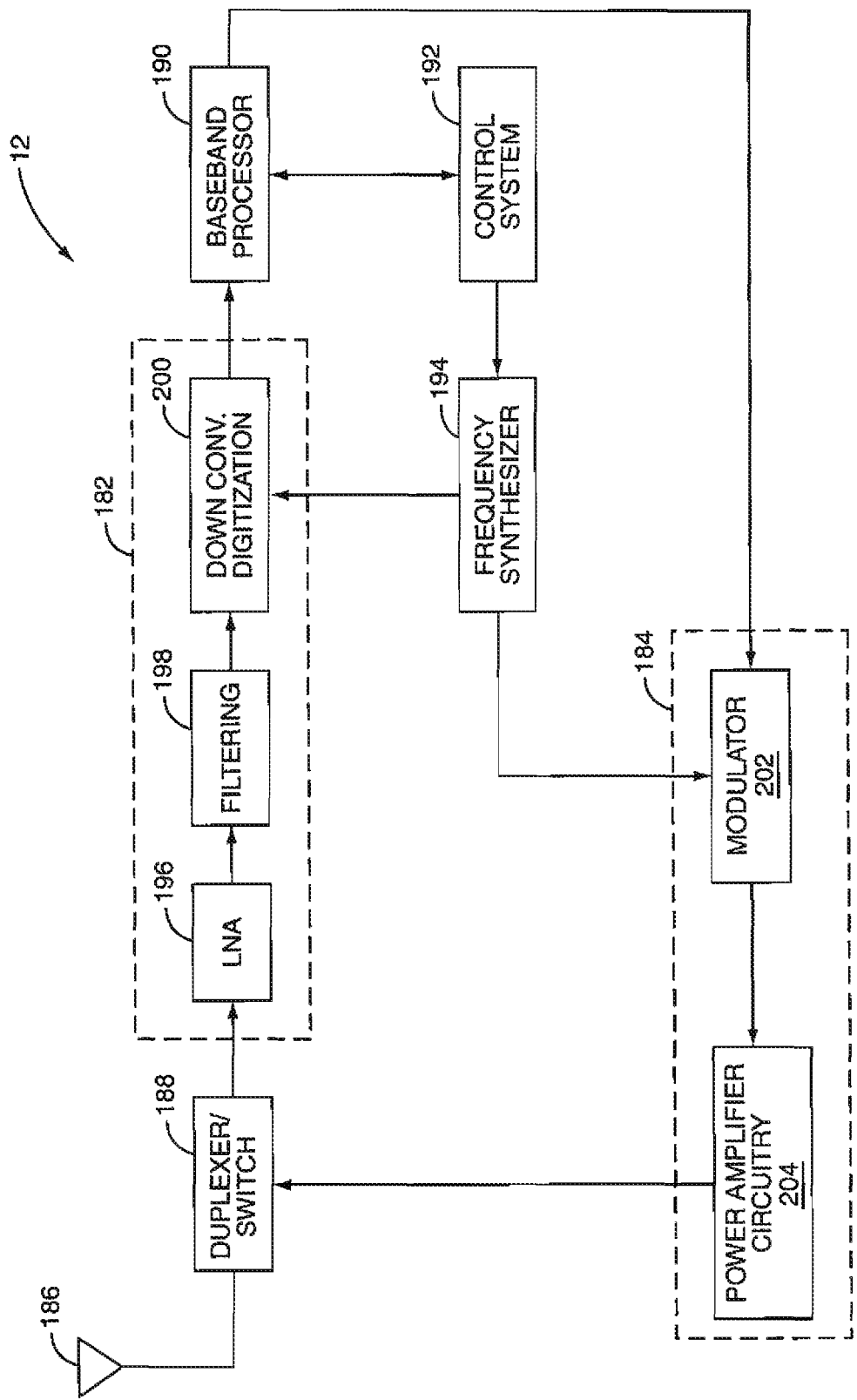

FIG. 12 shows details of the first base station illustrated in FIG. 1.

Figure 13:
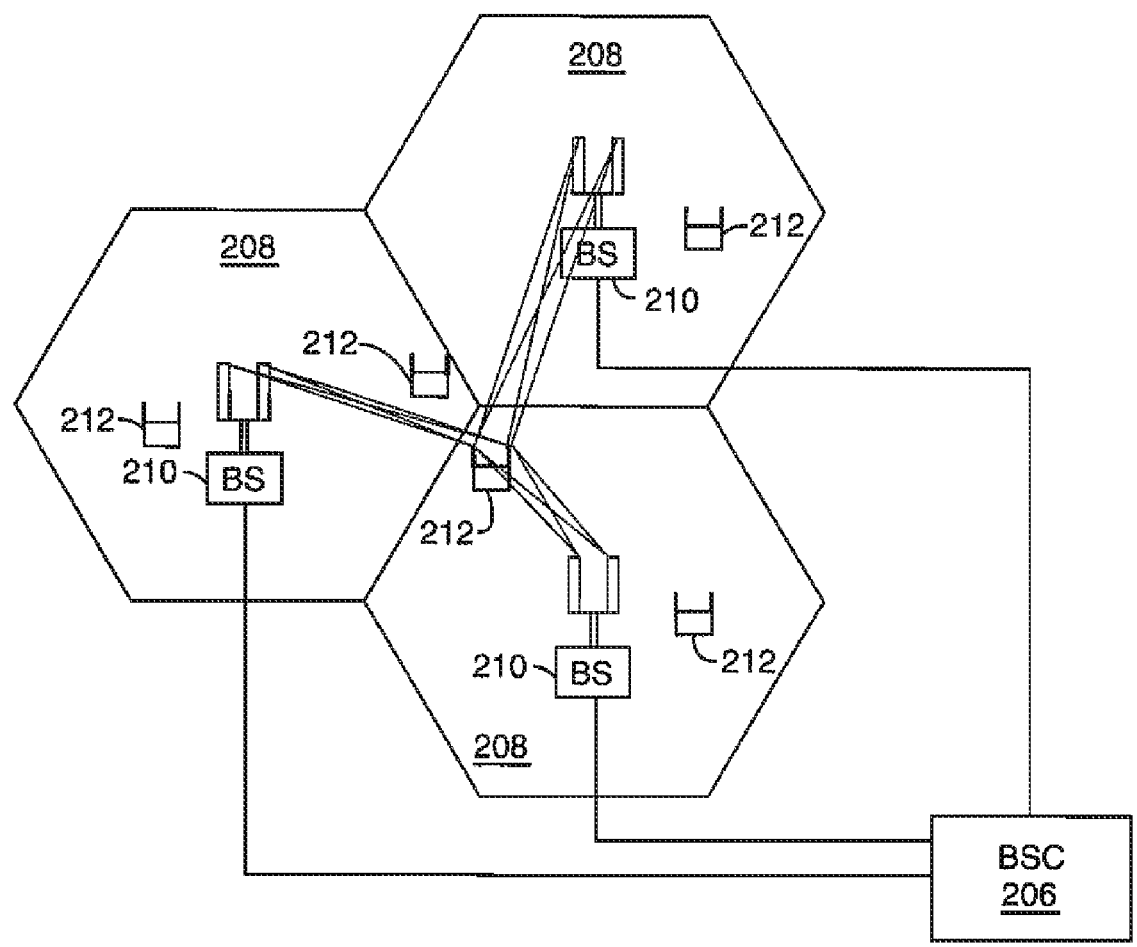

FIG. 13 is a block representation of a cellular communication system.

Figure 14:
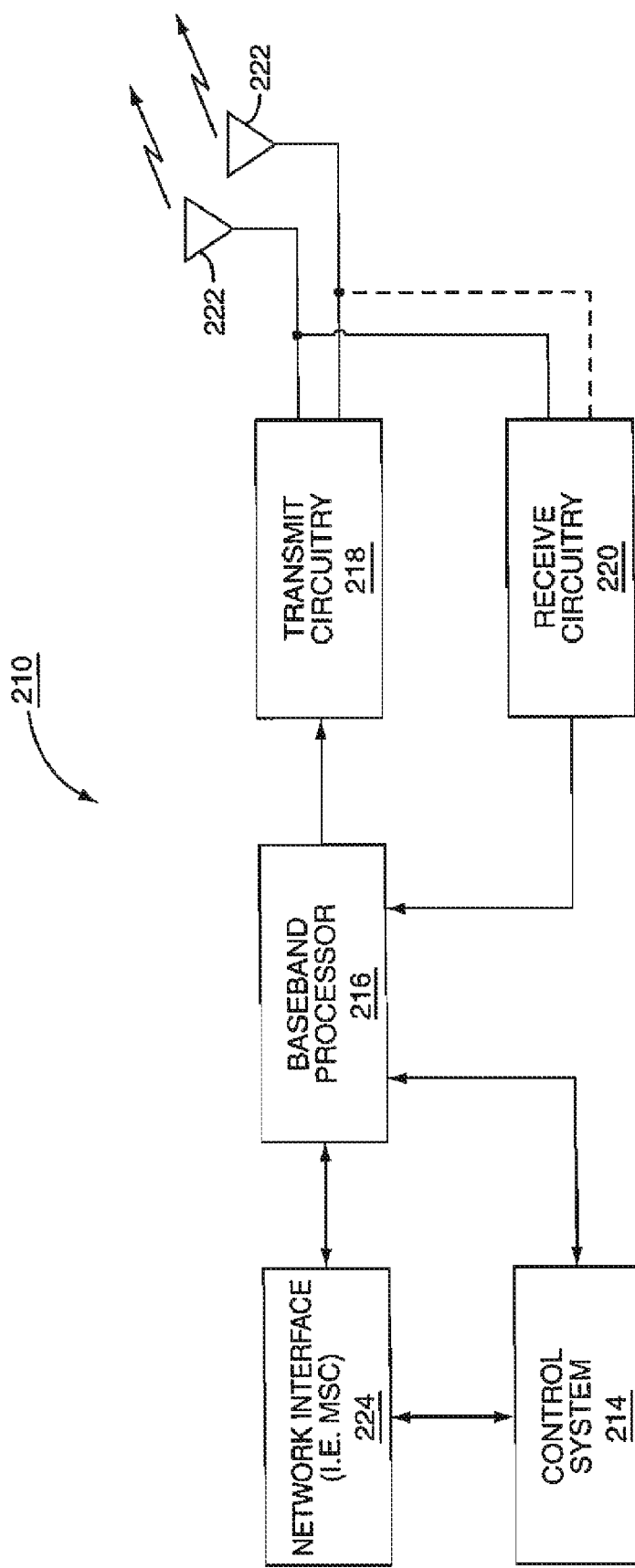

FIG. 14 is a block representation of a base station according to one embodiment of the present invention.

Figure 15:
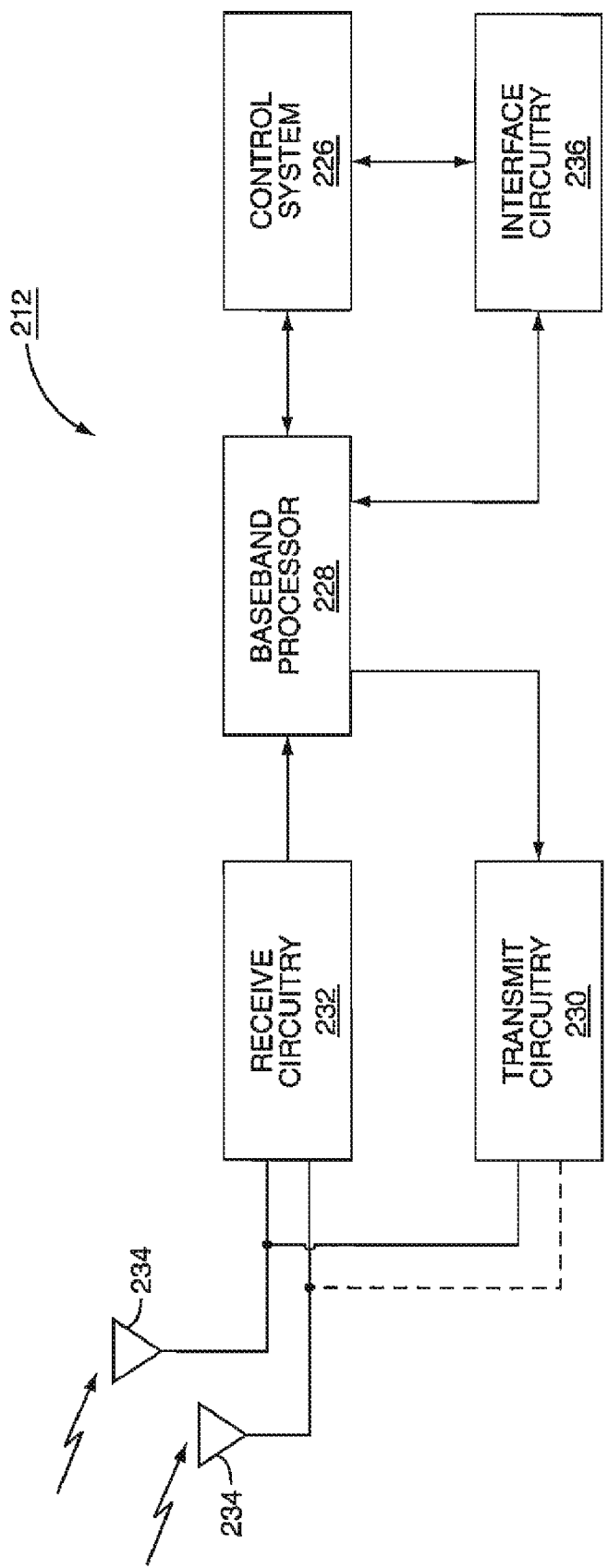

FIG. 15 is a block representation of a mobile terminal according to one embodiment of the present invention.

Figure 16:
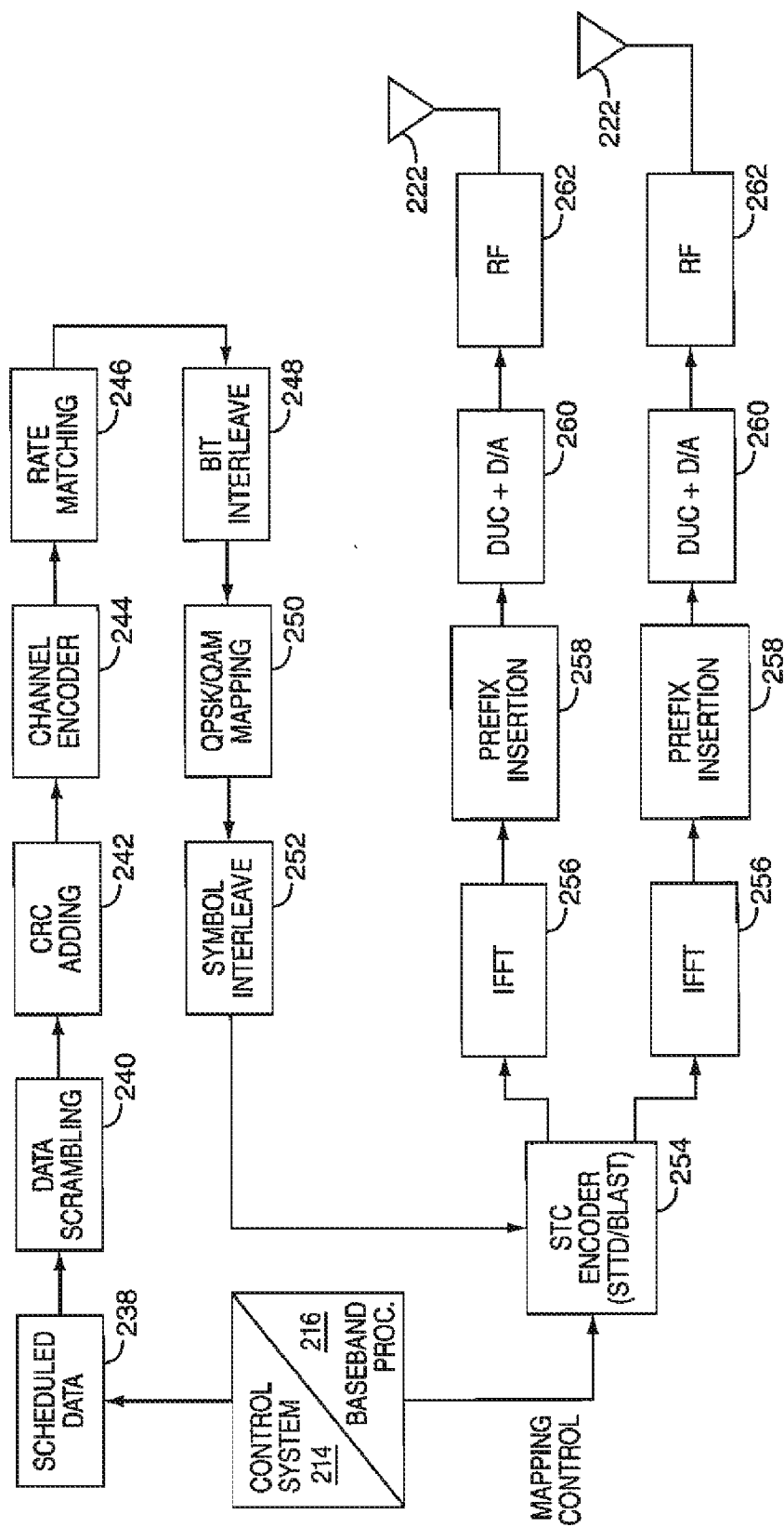

FIG. 16 is a logical breakdown of an OFDM transmitter architecture according to one embodiment of the present invention.

Figure 17:
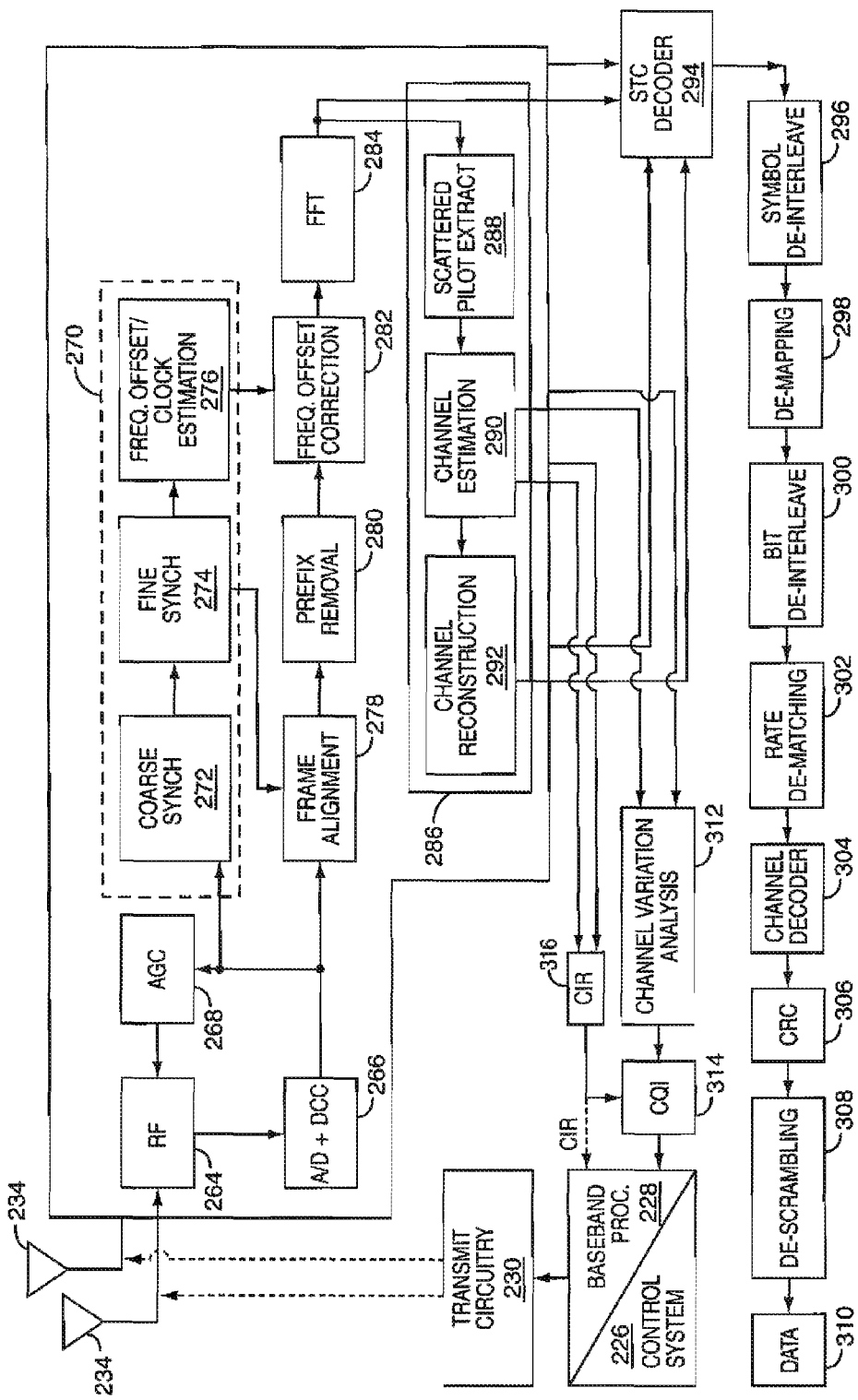

FIG. 17 is a logical breakdown of an OFDM receiver architecture according to one embodiment of the present invention.

Figure 18:
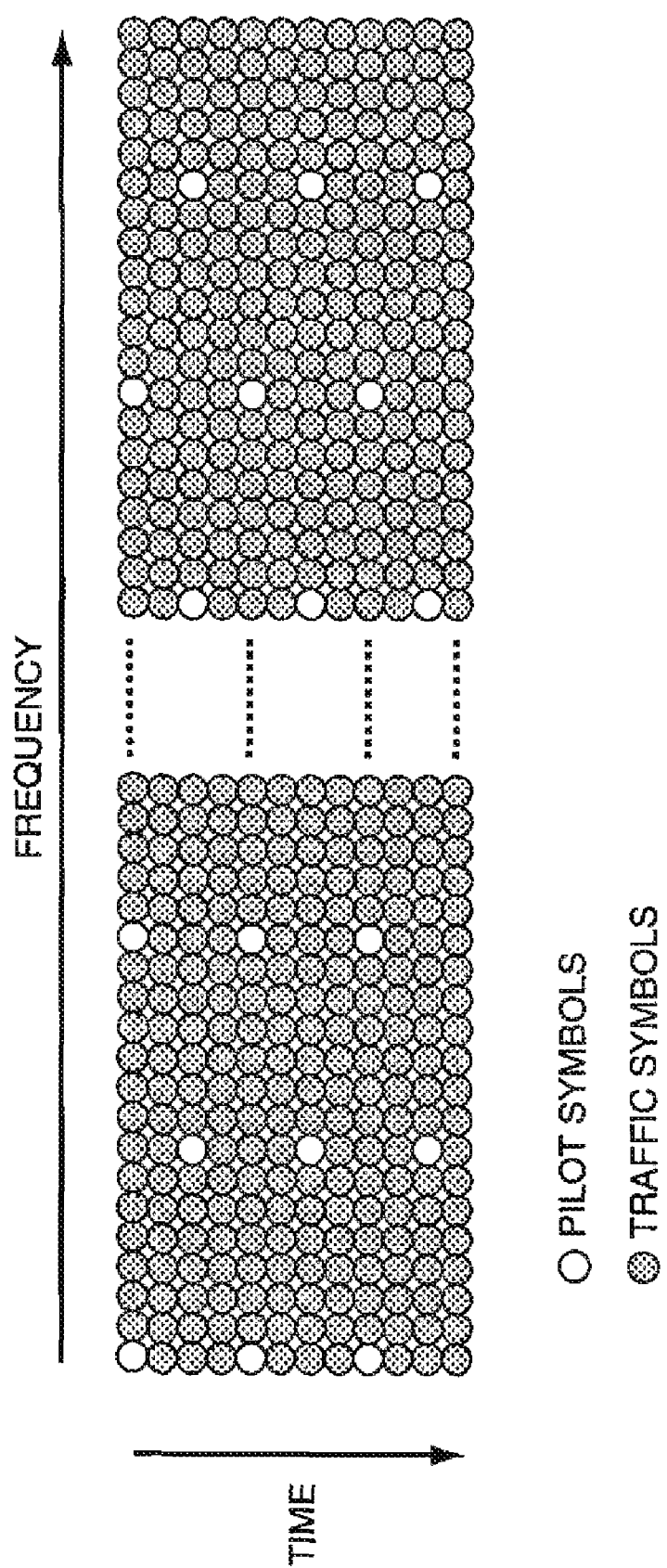

FIG. 18 illustrates a pattern of sub-carriers for carrying pilot symbols in an OFDM environment.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention employs hierarchical modulation to simultaneously transmit data over different modulation layers using a carrier RF signal. Each modulation layer may be of a higher or lower order than the other modulation layers. Certain embodiments of the present invention may transmit different information on the different modulation layers. Other embodiments of the present invention may use the different layers for processing different information streams.

Transmitting different information on different modulation layers may provide many useful applications. Unicast data is transmitted to a single user, whereas broadcast data is transmitted to multiple users. The present invention includes any combination of unicast data and broadcast data to be transmitted using any combination of the different modulation layers. Unicast data and broadcast data include different types of content, including audio content, video content, voice content, and specific data content.

Audio content may provide at least one channel of audio programming, which may provide an on demand audio program that is unicast to a single user, or distributed audio programs that are broadcast to multiple users. Similarly, video content may provide at least one channel of video programming. Voice content may include individual cellular telephone calls. Specific data content may include internet data, including emails, short messaging service messages, or downloaded information. The present invention includes any combination of types of content to be transmitted using any combination of the different modulation layers.

In the present invention, the different information on different modulation layers may be transmitted to different geographic areas. The content of the different information may be associated with different geographic areas. One example is a national news program may be broadcast to a large geographic area from multiple communication interfaces, such as base stations, using one modulation layer, and a local traffic program may be broadcast to a subset of the large geographic area from one communications interface, such as a base station, using a different modulation layer.

The present invention may include using the different modulation layers in conjunction with other techniques for processing different information streams. One modulation layer may be used to provide broadcast data to multiple base stations that form a single frequency network (SFN). A SFN may be used to improve signal coverage of broadcast data by transmitting the same information at the same time from multiple antennas.

MIMO adds antennas to a system to provide spatial multiplexing, diversity, or both. The information transmitted from MIMO antennas may be provided from any combination of the different modulation layers. The additional MIMO antennas may be used to strengthen a SFN. One modulation layer may be used to provide broadcast data, which is transmitted from multiple MIMO antennas simultaneously. Another modulation layer may be used to provide multiple channels of data, which are transmitted from different MIMO antennas.

Video broadcast data may have high bandwidth requirements. OFDM or SC-FDM can distribute a high bandwidth signal onto multiple sub-carriers of lower bandwidth. The present invention may be used to provide at least one sub-carrier using one modulation layer, and other information using at least one other modulation layer.

Multi-hop and relayed transmissions provide broadcast data or other system data to multiple base stations. The present invention may be used to provide any combination of system data, relayed data, and end user data using any combination of modulation layers. Certain modulation techniques may include one or more modulation layers that are compatible with modulation techniques that are used in existing communications networks. Therefore, the present invention may provide compatibility between different communications systems by using compatible modulation layers, which may allow an upgraded communications system to be backward compatible with a legacy user element (UE).

The present invention may be used to simultaneously download information directly to a user element (UE) and to transmit system information to system transceivers, such as communications interfaces, which may include base stations, cellular phone base stations, repeaters, relays, access points, or the like. The system information may include information for downloading by other system transceivers and synchronization information for broadcasting user information from multiple transceivers and antennas simultaneously. The present invention may provide compatibility between different communications systems having different modulation schemes, which may allow an upgraded communications system to be backward compatible with legacy UE. Additionally, low cost UE using the legacy modulation scheme could be feasible with such a system. For example, an upgraded system using multiple antennas, such as MIMO may be compatible with systems using single antennas, such as single input single output (SISO). A basic broadcast channel may be transmitted using one modulation layer from all of the MIMO antennas, and multiple supplemental broadcast channels may be transmitted using another modulation layer from different MIMO antennas. Legacy UE may receive the basic broadcast channel; however, upgraded UE is required to receive the supplemental broadcast channels.

Multiplexing is a processing technique for transmitting different streams of information using a common transmission entity. Frequency division multiplexing (FDM) transmits different streams of information using different frequencies. Time division multiplexing (TDM) interleaves different streams of information into a single combined information stream, which is then transmitted. Orthogonal frequency division multiplexing (OFDM) and single carrier frequency division multiplexing (SC-FDM) may combine FDM and TOM to create multiple sub-carriers for transmitting different streams of information. Other multiplexing techniques may be used with OFDM and SC-FDM to provide additional sub-carriers. Multiple input multiple output (MIMO) is a multiple antenna architecture, which may provide spatial multiplexing by allowing different information to be transmitted using different antennas. The present invention is associated with a new multiplexing technique called modulation division multiplexing (MDM), by transmitting different information on different modulation layers. MDM may be associated with a new multiple access technique called modulation division multiple access (MDMA). The present invention may be used with a single carrier RF signal, a multiple carrier RF signal, or both. Any frequency or bandwidth RF signal may be used with the present invention. In one embodiment of the present invention, information may be transmitted to one end user using one modulation layer, and information may be transmitted to a different end user using a different modulation layer.

An existing user element may be able to receive and transmit only the lower modulation layer, and ignore the higher modulation layer. An upgraded system may be backward compatible with existing communications equipment using existing features, while adding additional features that may be supported with upgraded equipment. In one embodiment of the present invention, the hierarchical modulation method includes rectangular quadrature amplitude modulation (QAM), where lower layer modulation layer bits are encoded with only phase shifting, such as data used with quadrature phase shift keying (QPSK), and upper modulation layer bits are encoded with QAM; however, existing communications equipment may ignore the QAM data bits and receive only those bits encoded with quadrature phase shift keying.

FIG. 1 shows an RE communications system 10, such as a cellular communications system, having a first base station 12 with a first antenna port ANT1 coupled to a first base station antenna 14, a second base station 16 with the first antenna port ANT1 coupled to a second base station antenna 18, a first mobile terminal 20 with the first antenna port ANT1 coupled to a first mobile antenna 22, a fixed terminal 24 with the first antenna port ANT1 coupled to a fixed terminal antenna 26, a second mobile terminal 28 with the first antenna port ANT1 coupled to a second mobile antenna 30, and a third mobile terminal 32 with the first antenna port ANT1 coupled to a third mobile antenna 34. The antennas 14, 18, 22, 26, 30, 34 transmit and receive radiated RF signals 36. The base stations 12, 16 control information flow to and from the terminals 20, 24, 28, 32, which ideally are controlled by whichever base station is the closest, presents the best quality RF link, or both.

Figure 2A:
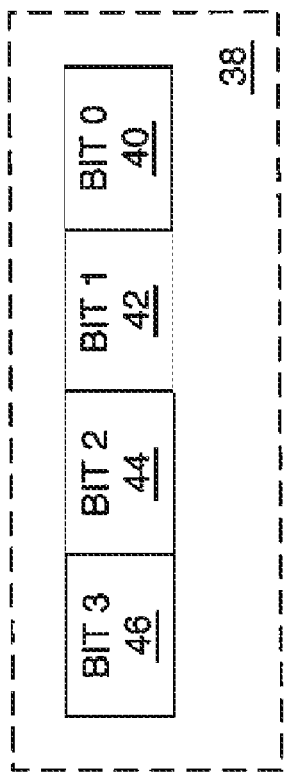
FIG. 2A shows a modulation symbol having 4 bits of information.

The radiated RF signals 36 are modulated to encode digital information. A number of modulation and encoding techniques may be used, including frequency modulation (FM) with frequency shift keying (FSK), phase modulation (PM) with phase shift keying (PSK), amplitude modulation (AM) with amplitude shift keying (ASK), or any combination thereof. One common modulation technique in cellular communications systems is a combination of AM and PM, which is called quadrature amplitude modulation (QAM). One common modulation technique in early generations of cellular communications systems is quadrature phase shift keying (QPSK), which can encode 2 bits of information with each modulation symbol, or phase shift. FIG. 2A shows a modulation symbol 38 having 4 bits of information, including bit zero 40, bit one 42, bit two 44, and bit three 46. To encode 4 bits of information, 16 different possible modulation points are required for each modulation symbol 38.

Figure 2B:
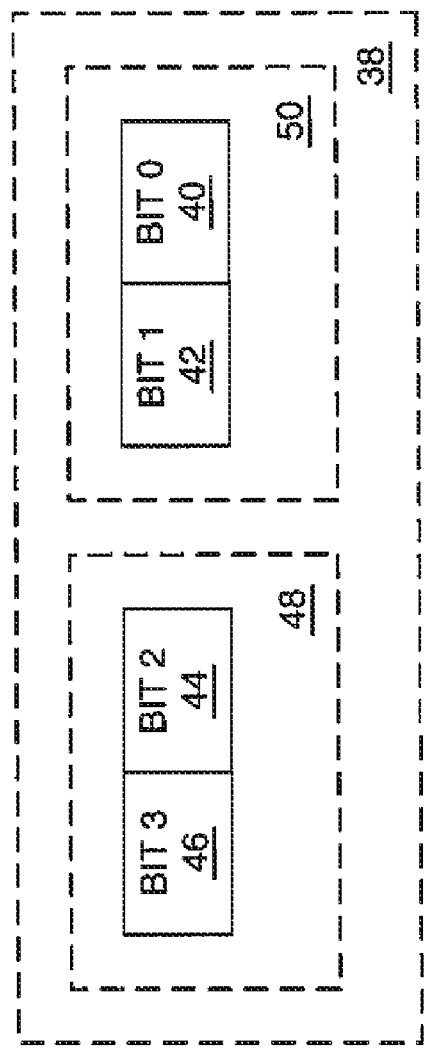
FIG. 2B shows one embodiment of the present invention wherein the modulation symbol illustrated in FIG. 2A is divided into a lower modulation sub-symbol and a higher modulation sub-symbol.

FIG. 2B shows one embodiment of the present invention by dividing the modulation symbol 38 illustrated in FIG. 2A into a lower modulation sub-symbol 48 and a higher modulation sub-symbol 50. The lower modulation sub-symbol 48 includes bit two 44 and bit three 46. The higher modulation sub-symbol 50 includes bit zero 40 and bit one 42. The lower and higher modulation sub-symbols 48, 50 may encode information that is unrelated, that may be on different channels or sub-channels, or that may be differentiated in some manner.

Figure 2C:
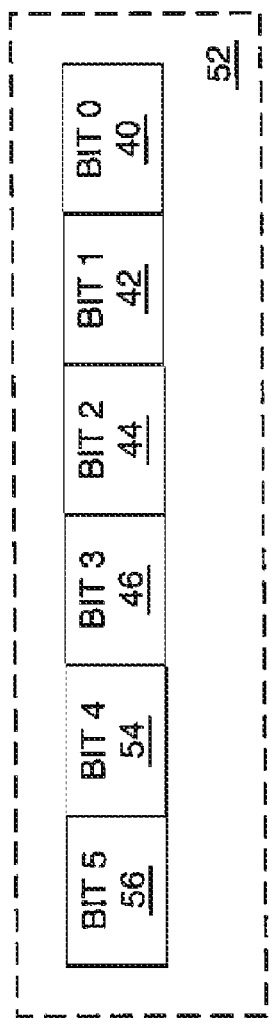
FIG. 2C shows a modulation symbol having 6 bits of information.
Figure 2D:
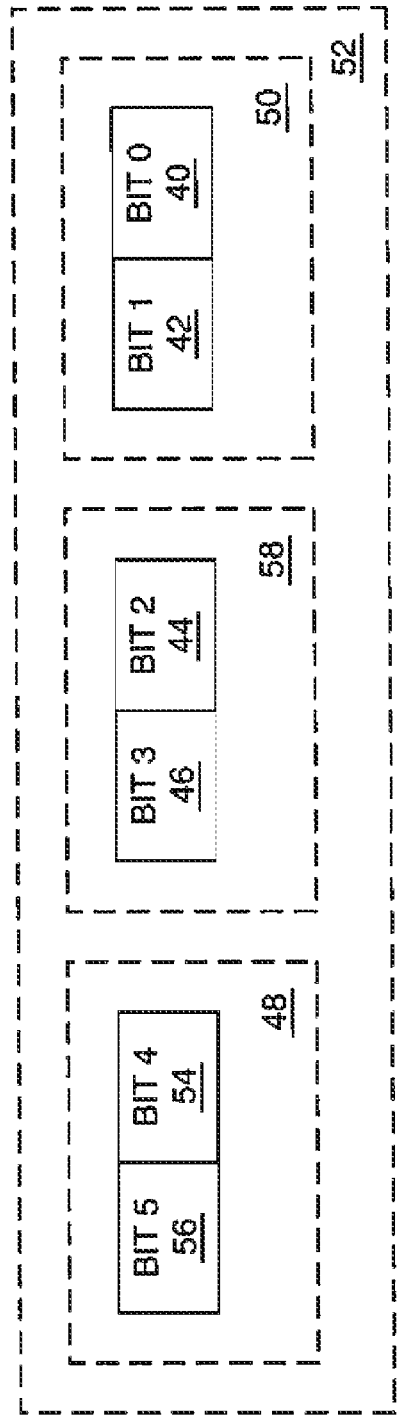
FIG. 2D shows one embodiment of the present invention wherein the modulation symbol illustrated in FIG. 2C is divided into a lower modulation sub-symbol, a middle modulation sub-symbol, and a higher modulation sub-symbol.

FIG. 2C shows a modulation symbol 52 having 6 bits of information, including bit zero 40, bit one 42, bit two 44, bit three 46, bit four 54, and bit five 56. To encode 6 bits of information, 64 different possible modulation points are required for each modulation symbol 52. FIG. 2D shows one embodiment of the present invention by dividing the modulation symbol 52 illustrated in FIG. 2C into a lower modulation sub-symbol 48, a middle modulation sub-symbol 58, and a higher modulation sub-symbol 50. The lower modulation sub-symbol 48 includes bit four 54 and bit five 56. The middle modulation sub-symbol 58 includes bit two 44 and bit three 46. The higher modulation sub-symbol 50 includes bit zero 40 and bit one 42. The lower, middle, and higher sub-symbols 48, 58, 50 may encode information that is unrelated, that may be on different channels or sub-channels, or that may be differentiated in some manner. Other embodiments of the present invention may divide the modulation symbol 52 into more than three hierarchical modulation sub-symbols, such as the lower modulation sub-symbol 48, the middle modulation sub-symbol 58, the higher modulation sub-symbol 50, and at least one supplemental modulation sub-symbol.

The present invention may use a modulation symbol, which may be divided into any number of sub-symbols. Each sub-symbol may include any number of bits. Each bit of data in a modulation sub-symbol may be used to transmit data intended for one unique receiver only or for more than one receiver. Multiple bits of data in a modulation sub-symbol may be used to transmit data intended for one unique receiver only or for more than one receiver. Any receiver that receives transmitted data may receive all or part of a modulation symbol. The receiver may process all or part of a modulation symbol. The receiver may receive one or more sub-symbols. The receiver may process one or more sub-symbols. The receiver may receive one or more bits in a sub-symbol. The receiver may process one or more bits in a sub-symbol. For example, bit zero 40 may be used to transmit data to a first receiver, bit one 42 may be used to transmit data to a second receiver, bit two 44 may be used to transmit data to a third receiver, bit three 46 may be used to transmit data to a fourth receiver, bit four 54 may be used to transmit data to a fifth receiver, and bit five 56 may be used to transmit data to a sixth receiver. Alternatively, bit zero 40 may be used to transmit data to a first receiver, bit one 42 may be used to transmit data to a second receiver, bits two and three 44, 46 may be used to transmit data to a third receiver, and bits four and five 54, 56 may be used to transmit data to a plurality of receivers.

Figure 3:
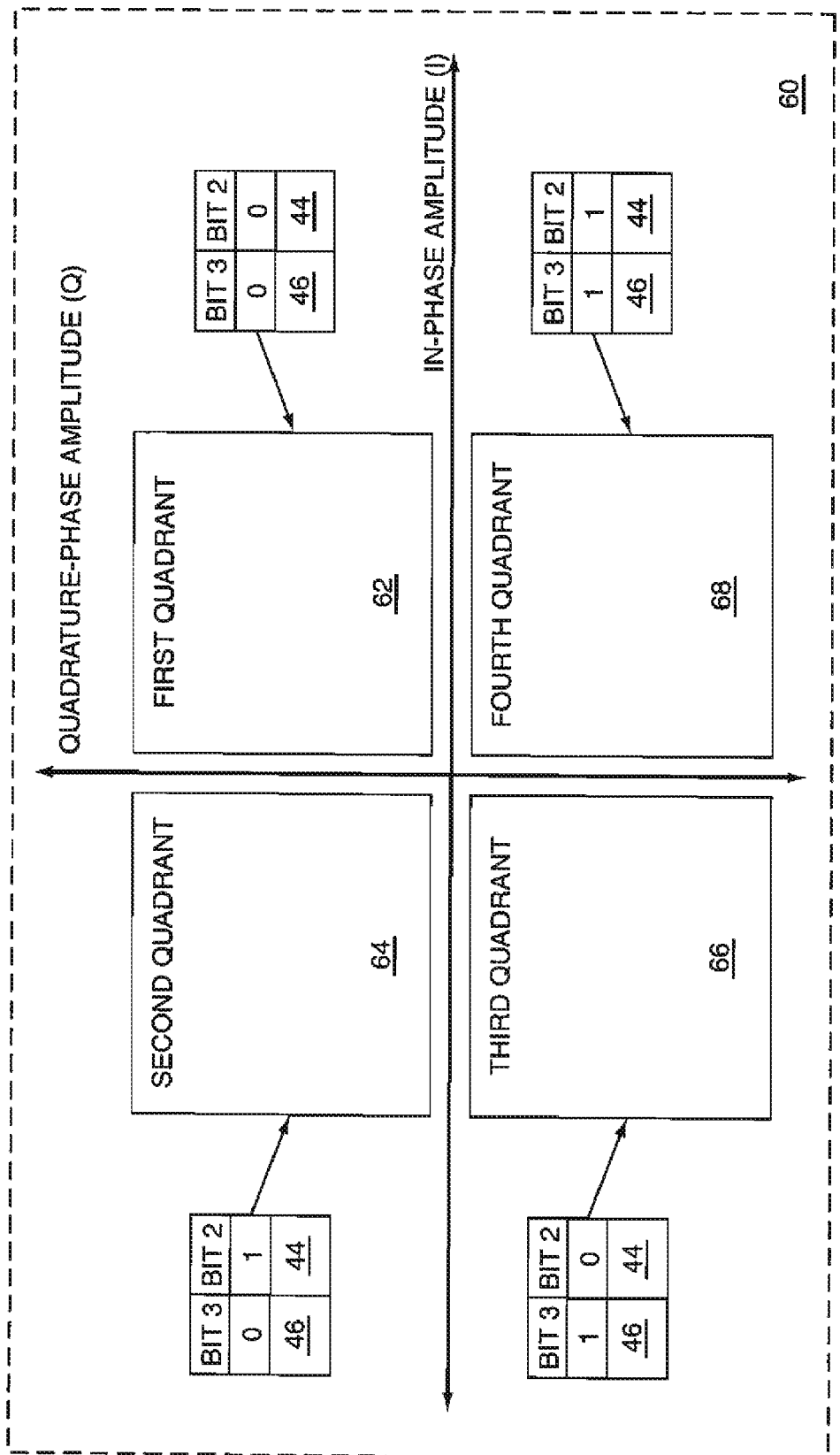
FIG. 3 shows the present invention used with quadrature modulation.

FIG. 3 shows one embodiment of the present invention used with quadrature modulation 60, which is associated with phase modulation. Phase-shifts may be represented graphically on a two dimensional grid having an in-phase axis and a quadrature-phase axis. The two dimensional grid may be divided into four quadrants, including a first quadrant 62, a second quadrant 64, a third quadrant 66, and a fourth quadrant 68. If the four quadrants are used to represent four different possible modulation points, then two bits of information can be encoded, which could correspond with bits two and three 44, 46 of the lower modulation sub-symbol 48. The first quadrant 62 may be represented with bit two 44 equal to a zero and bit three 46 equal to a zero. The second quadrant 64 may be represented with bit two 44 equal to a one and bit three 46 equal to a zero. The third quadrant 66 may be represented with bit two 44 equal to a zero and bit three 46 equal to a one. The fourth quadrant 68 may be represented with bit two 44 equal to a one and bit three 46 equal to a one.

Figure 4:
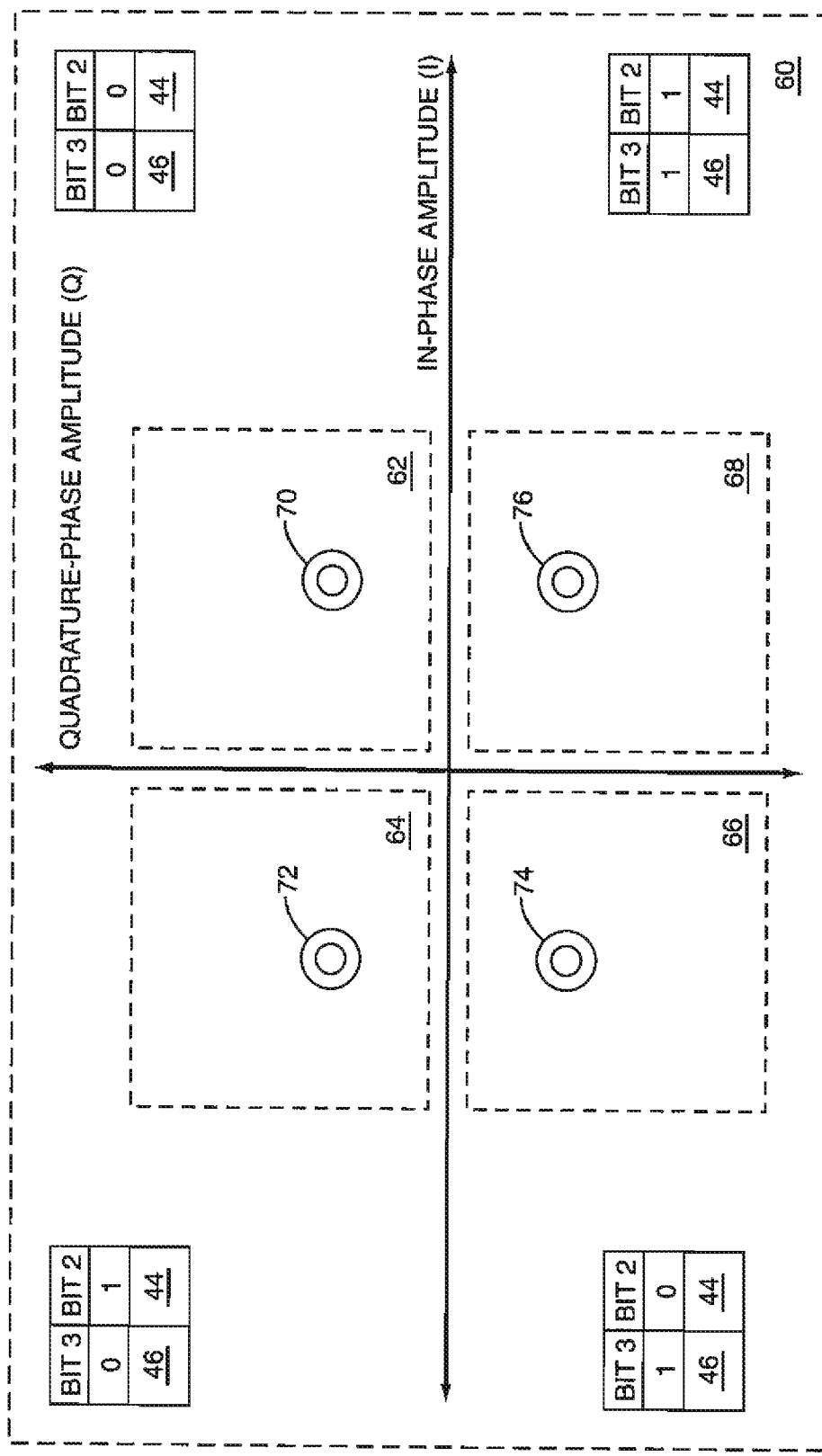
FIG. 4 shows the four constellation points used in quadrature phase shift keying (QPSK) modulation, and their relationship with the lower modulation sub-symbol.

FIG. 4 shows the four constellation points used in quadrature phase shift keying (QPSK) modulation, and their relationship with the lower modulation sub-symbol 48, including bits two and three 44, 46. The four constellation points include a first quadrant point 70, a second quadrant point 72, a third quadrant point 74, and a fourth quadrant point 76. The four constellation points used in QPSK have equal amplitudes and are differentiated only by phase; however, as long as the constellation points fall within the correct quadrant 62, 64, 66, 68, the lower modulation sub-symbol 48, including bits two and three 44, 46 will be decoded correctly. This characteristic may be beneficial in mixing a system with phase and amplitude modulation, such as QAM, with a system having only phase modulation, such as QPSK. The QPSK system may be able to reliably receive and transmit the lower modulation sub-symbol 48 in systems with QAM; therefore, upgraded communications equipment using QAM may be backward compatible with existing communications equipment using QPSK for certain features. In one embodiment of the present invention, a communications system may alternate between transmitting QAM signals and QPSK signals. Other embodiments of the present invention may use other combinations of FM, PM, and AM to provide hierarchical modulation systems. Some embodiments of such systems may be backward compatible.

Figure 5:
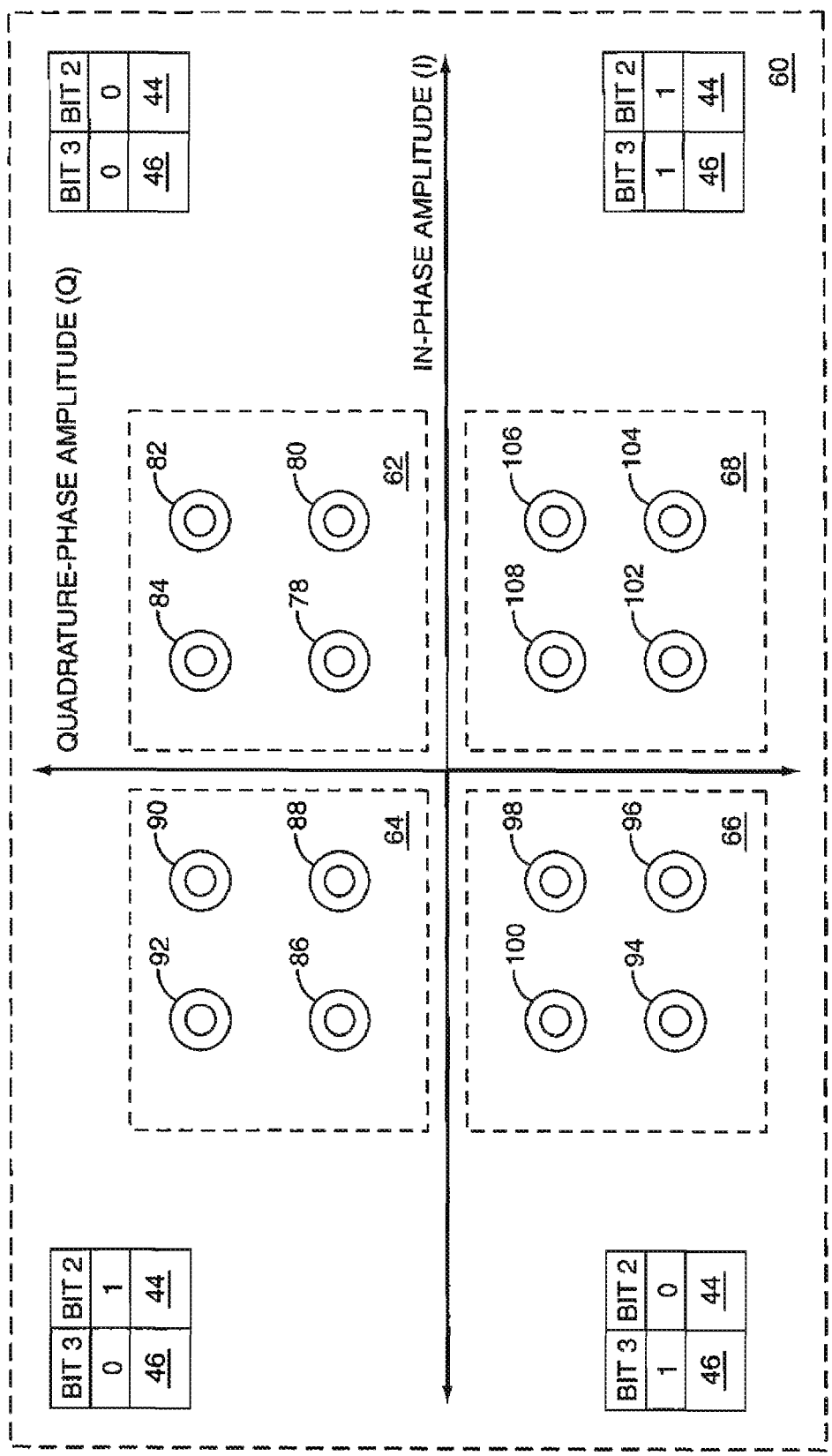
FIG. 5 shows the 16 constellation points used in rectangular sixteen quadrature amplitude modulation (16-QAM), and their relationship with the lower modulation sub-symbol.

FIG. 5 shows the 16 constellation points used in rectangular sixteen quadrature amplitude modulation (16-QAM), and their relationship with the lower modulation sub-symbol 48. With 16 different possible modulation points, then 4 bits of information can be encoded, which could correspond with bits two and three 44, 46 of the lower modulation sub-symbol 48 and bits zero and one 40, 42 of the higher modulation sub-symbol 50. The sixteen constellation points include a first quadrant first higher point 78, a first quadrant second higher point 80, a first quadrant third higher point 82, a first quadrant fourth higher point 84, a second quadrant first higher point 86, a second quadrant second higher point 88, a second quadrant third higher point 90, a second quadrant fourth higher point 92, a third quadrant first higher point 94, a third quadrant second higher point 96, a third quadrant third higher point 98, a third quadrant fourth higher point 100, a fourth quadrant first higher point 102, a fourth quadrant second higher point 104, a fourth quadrant third higher point 106, and a fourth quadrant fourth higher point 108.

Figure 6:
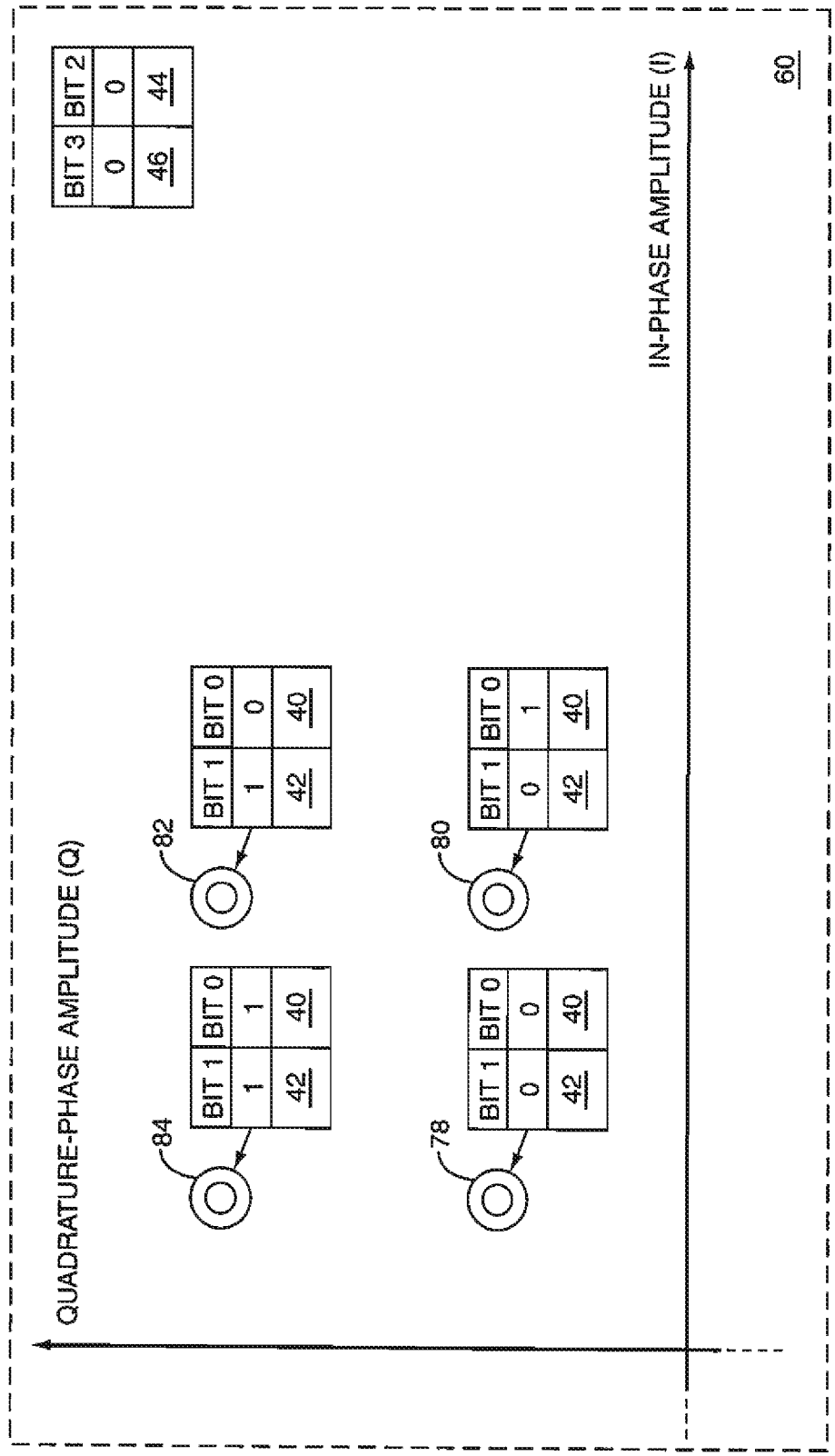
FIG. 6 shows the 4 constellation points used in the first quadrant of 16-QAM.

FIG. 6 shows the 4 constellation points used in the first quadrant 62 of 16-QAM, which include the first quadrant points 78, 80, 82, 84. If the four first quadrant points 78, 80, 82, 84 are used to represent 4 different possible modulation points, then 2 bits of information can be encoded, which could correspond with bits zero and one 40, 42 of the higher modulation sub-symbol 50. The first quadrant first higher point 78 may be represented with bit zero 40 equal to a zero and bit one 42 equal to a zero. The first quadrant second higher point 80 may be represented with bit zero 40 equal to a one and bit one 42 equal to a zero. The first quadrant third higher point 82 may be represented with bit zero 40 equal to a zero and bit one 42 equal to a one. The first quadrant fourth higher point 84 may be represented with bit zero 40 equal to a one and bit one 42 equal to a one. In one embodiment of the present invention, the phases and amplitudes separating the first quadrant points 78, 80, 82, 84 from each other may be less than the phases and amplitudes separating the groups of first quadrant points 78, 80, 82, 84, second quadrant points 86, 88, 90, 92, third quadrant points 94, 96, 98, 100, and fourth quadrant points 102, 104, 106, 108 from each other; therefore, the reliability of data provided with the lower modulation sub-symbol 48, called lower modulation layer data, may be greater than that provided for the higher modulation sub-symbol 50, called higher modulation layer data, particularly with wireless communications links with low signal margins. In wireless communications links that operate with high signal margins most of the time, the difference in the reliabilities may be undetectable; however, the reliabilities over time, called average reliabilities will show differences due to those situations that may occasionally produce low signal margins.

In an alternate embodiment of the present invention, the hierarchical modulation method includes sixty-four quadrature amplitude modulation (64-QAM), which uses 64 constellation points. With 64 different possible modulation points, six bits of information can be encoded. The six bits of information may be associated with two, three, or more modulation layers. Each of the modulation layers may be associated with one bit, two bits, three bits, or any combination thereof. Generally, the present invention may be used with any modulation method, encoding any number of bits, and associating the encoded bits with any number of modulation layers. The modulation layers may all be allocated to two or more users in any combination. In an exemplary embodiment of the present invention, 64-QAM is used to encode six bits of information. Two of the six bits are associated with a first modulation layer. Another two of the six bits are associated with a second modulation layer. The remaining two of the six bits are associated with a third modulation layer. The three modulation layers may be used to transmit three different streams of data to three different user elements. Alternatively, the bits of any or all of the modulation layers may be divided to transmit one stream of data to one user element and a different stream of data to a different user element.

Broadcast data is data that is intended to be received by more than one end user. Another frequently encountered term in communications is multicast. The only difference between broadcast data and multicast data is that broadcast data is intended for more end users than multicast data; however, since there is no accepted dividing line between multicast data and broadcast data, in this specification the term broadcast should be taken to mean broadcast, multicast, or both. Broadcast data may be audio, video, or both. Examples of broadcast data include video programs and audio programs. Broadcast data with national content may include network programs such as national newscasts or movies. Broadcast data with regional content may include regional newscasts or statewide information programs. Broadcast data with local content may include weather or traffic information. Broadcast data with basic content may include network channels or news channels. Broadcast data with supplemental content may include special interest channels, such as a sports channel or an educational channel. Unicast data is data that is intended to be received by one end user. Examples of unicast data include voice unicast data, such as cellular phone calls, specific unicast data, such as email messages, short message services, audio unicast data, such as an on-demand audio program, and video unicast data, such as an on-demand video program.

Broadcast data or unicast data may be transmitted using channels or sub-channels. A channel is a flow of information that contains all of the information associated with an information group, such as a video program together with its associated audio channels and sub-titles. Sub-channels are used to divide a channel into multiple flows of information for transmission over some medium, such as a cellular network. The information group is reconstructed by combining the sub-channels. Sub-channels are commonly used when communications channels in a communications system have inadequate bandwidth to handle the full bandwidth of the information being transmitted.

The present invention includes processing different information streams using different modulation layers. OFDM is a technique for distributing data over a number of OFDM sub-carriers, which can be created by a number of different methods, so long as each sub-carrier is orthogonal with respect to other sub-carriers. In this context, orthogonal means each sub-carrier does not interfere with the other sub-carriers. The OFDM data can be provided by using carriers at different frequencies, which is known as frequency division multiplexing (FDM) associated with frequency division multiple access (FDMA), time multiplexing, which is known as time division multiplexing (TDM) associated with time division multiple access (TDMA), spatial multiplexing, which is a associated with multiple input multiple output (MIMO) systems that have multiple antennas such that each antenna may have different information, or any combination thereof. The present invention includes dividing modulation symbols, called modulation division multiplexing (MDM) associated with a new access technique called modulation division multiple access (MDMA). Related to OFDM is single carrier frequency division multiplexing (SC-FDM). The present invention may be used to provide one or more sub-carriers in an OFDM or SC-FDM system. Additionally, the present invention may be used with numerous multiplexing techniques, including FDM, TOM, special multiplexing, MDM, OFDM, SC-FDM, or any combination thereof.

In one embodiment of the present invention, the modulation sub-symbols 48, 50 may include different types of information selected from the following group, including video broadcast channels, video broadcast sub-channels, video unicast channels, video unicast sub-channels, audio broadcast channels, audio broadcast sub-channels, audio unicast channels, audio unicast sub-channels, voice unicast data, specific unicast data, OFDM data, and OFDM sub-carriers. Other embodiments of the present invention may include more than two different modulation layers.

In one embodiment of the present invention, the lower modulation sub-symbol 48 includes broadcast data having national content, and the higher modulation sub-symbol 50 includes broadcast data having local content. In an alternate embodiment of the present invention, the lower modulation sub-symbol 48 includes broadcast data having basic content, and the higher modulation sub-symbol 50 includes broadcast data having supplemental content. In an additional embodiment of the present invention, the lower modulation sub-symbol 48 includes information intended to be directly received by a user element (UE). The higher modulation sub-symbol 50 includes information intended to be received by a relay station for forwarding to other relay stations, LIE, or both. A base station may serve as a relay station. A synchronization signal may be included to synchronize transmissions to UE from multiple base stations or relay stations. The information included in the lower modulation sub-symbol 48 may be repeated in the higher modulation sub-symbol 50. The synchronization signal may include a preamble to facilitate synchronization.

The present invention includes processing different information streams using different modulation layers. Such processing may include providing a single frequency network (SFN). An SFN may be formed when multiple antennas in an RF communications system 10 transmit the same information on the same modulation layer at the same time, which provides robust data transmission since the multiple signals may fill in coverage holes caused by shadowing and multi-path effects; therefore, higher broadcast data rates may be feasible with SFN. SFN data may be included in the lower modulation sub-symbol 48, the higher modulation sub-symbol 50, or both. Some or all of the broadcast data that incorporates the present invention may include SFN data.

The present invention employs hierarchical modulation to simultaneously transmit information on different modulation layers using a carrier RF signal. In one embodiment of the present invention, first data to be transmitted is assigned to a first modulation layer and second data is assigned to a second modulation layer based on reliability criteria. The first and second modulation layers are hierarchical modulation layers of the carrier RF signal. Once assigned, the first data is transmitted using the first modulation layer of the carrier RF signal and the second data is transmitted using the second modulation layer of the carrier RF signal. One modulation layer is generally a higher order than the other modulation layer.

In one embodiment of the present invention, all things being equal, the lower order modulation layer is generally more reliable than the higher order modulation layer. In general, the reliability criteria takes the reliability characteristics of the different modulation layers into account when assigning the first and second data to the different modulation layers. For example, reliability information may be derived from signal strength measurements or channel conditions to determine an appropriate modulation to use for transmitting certain data. Alternatively, different data may be associated with different transmission priorities. An example of reliability criteria related to transmission of the data is data that cannot be re-transmitted requires higher reliability than data that can be re-transmitted. Although maintaining data integrity is important for file transfers, the relative transmission priority for a file transfer is generally much lower than that for voice or other streaming media. In essence, the reliability criteria may relate to the communication channels, the transmission of the data, or both. For the various data, the reliability information is used to assign the various data to the different modulation layers for transmission.

In certain embodiments of the present invention, different data is broadcast to multiple users using different modulation layers. The different data is assigned to specific modulation layers based on reliability criteria. In one embodiment of the present invention, a single program is broken into two different data streams. One provides basic resolution content while the other provides optional higher resolution content. Upon receipt of the lower resolution content, only the lower resolution version of the program is available. If the higher resolution content is available, the lower and higher resolution versions of the program are combined to form a composite program of high resolution. With the present invention, the higher resolution content is transmitted using the lower order modulation layers and the lower resolution content is transmitted using the higher order modulation layers.

In voice applications, each modulation layer may support one or more voice calls. As such, the reliability criteria is used when assigning data for different voice calls to the different modulation layers. Some calls are supported on higher order modulation layers while others are supported on lower order modulation layers in light of the reliability criteria.

In one embodiment of the present invention, the base stations 12, 16 both transmit required broadcast data using the modulation layer with greater reliability, and transmit optional broadcast data using the modulation layer with lesser reliability. In an alternate embodiment of the present invention, the base stations 12, 16 both transmit either national or regional data using the modulation layer with greater reliability, wherein the first base station 12 transmits first local data and the second base station 16 transmits second local data using the modulation layer with lesser reliability. In an additional embodiment of the present invention, the base stations 12, 16 both transmit nominal resolution broadcast data using the modulation layer with greater reliability, and transmit enhanced resolution broadcast data using the modulation layer with lesser reliability. In an alternate embodiment of the present invention, the base stations 12, 16 both transmit basic programming data using the modulation layer with greater reliability, and transmit supplemental programming data using the modulation layer with lesser reliability. In yet another embodiment of the present invention, the base stations 12, 16 both may transmit broadcast video data. In an alternate embodiment of the present invention, the base stations 12, 16 may both transmit broadcast audio data.

In one embodiment of the present invention, the higher modulation layer data may include RF communications system control channel data. The base stations 12, 16 may both transmit broadcast data using lower modulation sub-symbols 48, and the first base station 12 may transmit unicast data directed to the first mobile terminal 20 using higher modulation sub-symbols 50. In an alternate embodiment of the present invention, the second base station 16 may transmit unicast data directed to the second mobile terminal 28 using one of the modulation sub-symbols 48, 50, and transmit unicast data directed to the third mobile terminal 32 using the other of the modulation sub-symbols 48, 50. The modulation layer with greater reliability is used with the data link with the lower signal margin, and the modulation layer with lower reliability is used with the data link with the greater signal margin.

The present invention includes transmitting different information using different modulation layers. Different embodiments will allocate the different information to the different modulation layers in different ways. Those skilled in the art will understand the concepts of the invention and will recognize applications of these concepts beyond the specific examples given. It should be understood that these concepts and applications fall within the scope of the disclosure and the accompanying claims. Specifically, the different information may be associated with any of the different modulation layers in any order. The present invention may use two, three, four, or more modulation layers. The different information may be intended for two or more end users associated with two or more user elements. The different information may be associated with the modulation layers in any combination.

Figure 7:
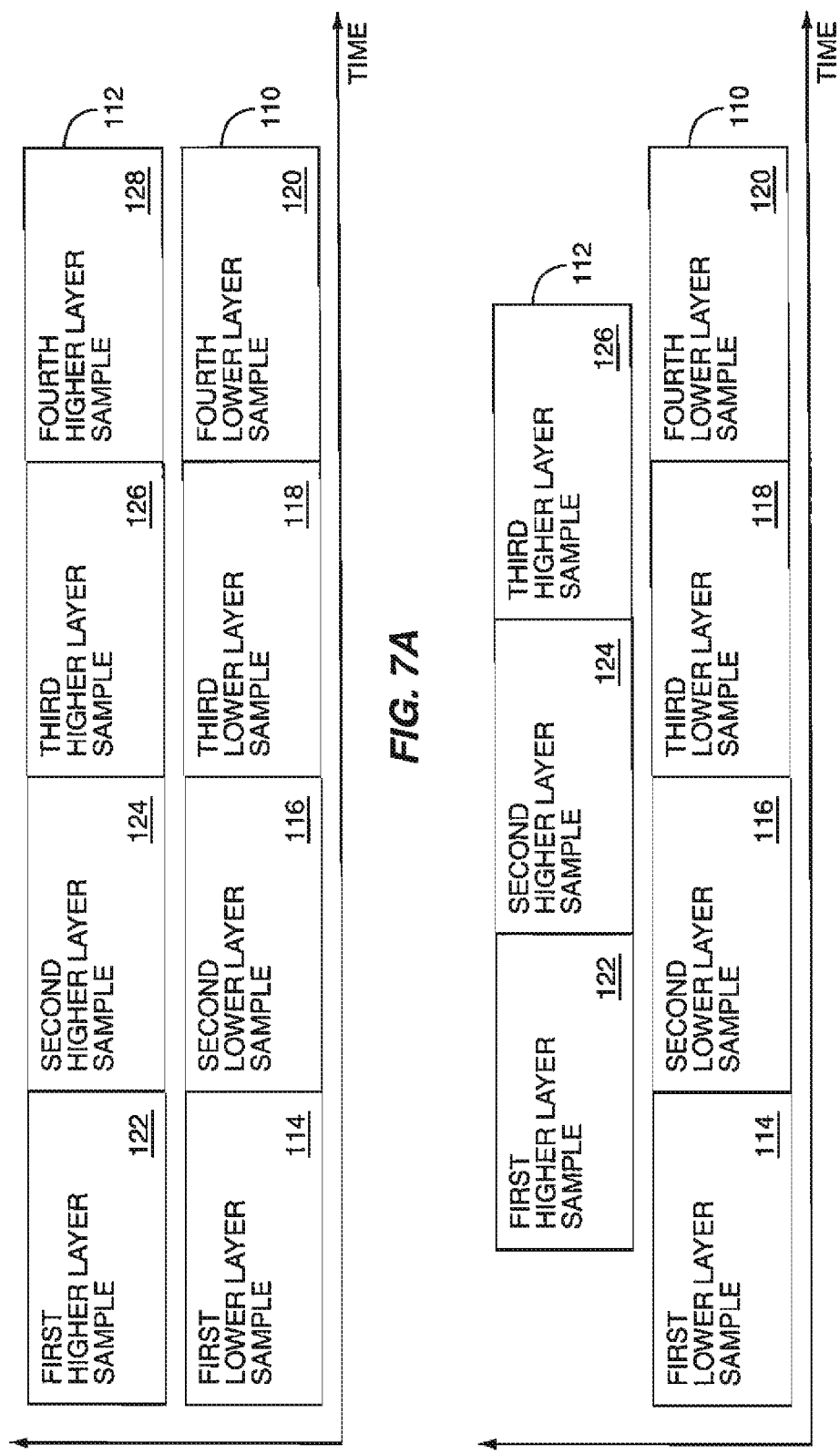
FIG. 7A shows the alignment of lower modulation layer data with higher modulation layer data in one embodiment of the present invention.
FIG. 7B shows the lower modulation layer data time-shifted from the higher modulation layer data in an alternate embodiment of the present invention.

FIG. 7A shows the alignment of lower modulation layer data 110 with higher modulation layer data 112 in one embodiment of the present invention. The lower modulation layer data 110 includes a first lower layer sample 114, a second lower layer sample 116, a third lower layer sample 118, and a fourth lower layer sample 120. The higher modulation layer data 112 includes a first higher layer sample 122, a second higher layer sample 124, a third higher layer sample 126, and a fourth higher layer sample 128. The lower layer samples 114, 116, 118, 120 are time aligned with the higher layer samples 122, 124, 126, 128. In mixing a system with phase and amplitude modulation, such as QAM, with a system having only phase modulation, such as QPSK, the constellation points of the QAM system may not directly align with the constellation points of the QPSK system; therefore, time-shifting the lower modulation layer data 110 from the higher modulation layer data 112 may improve signal margins. In an alternate embodiment of the present invention, the lower modulation layer data 110 is time-shifted from the higher modulation layer data 112 as illustrated in FIG. 7B. The higher layer samples 122, 124, 126 are time-shifted from the lower layer samples 114, 116, 118, 120, which may help average the higher layer samples 122, 124, 126 to make the lower layer samples 114, 116, 118, 120 line up closer to nominal constellation points of the QPSK system. A lower modulation rate for the lower modulation layer data 110 may further improve the impact of averaging. Even though the lower modulation layer data 110 is time-shifted from the higher modulation layer data 112, which means the lower modulation sub-symbol 48 is time-shifted from the higher modulation sub-symbol 50, both modulation sub-symbols 48, 50 fall within one modulation symbol period and are effectively transmitted simultaneously.

Figure 8:
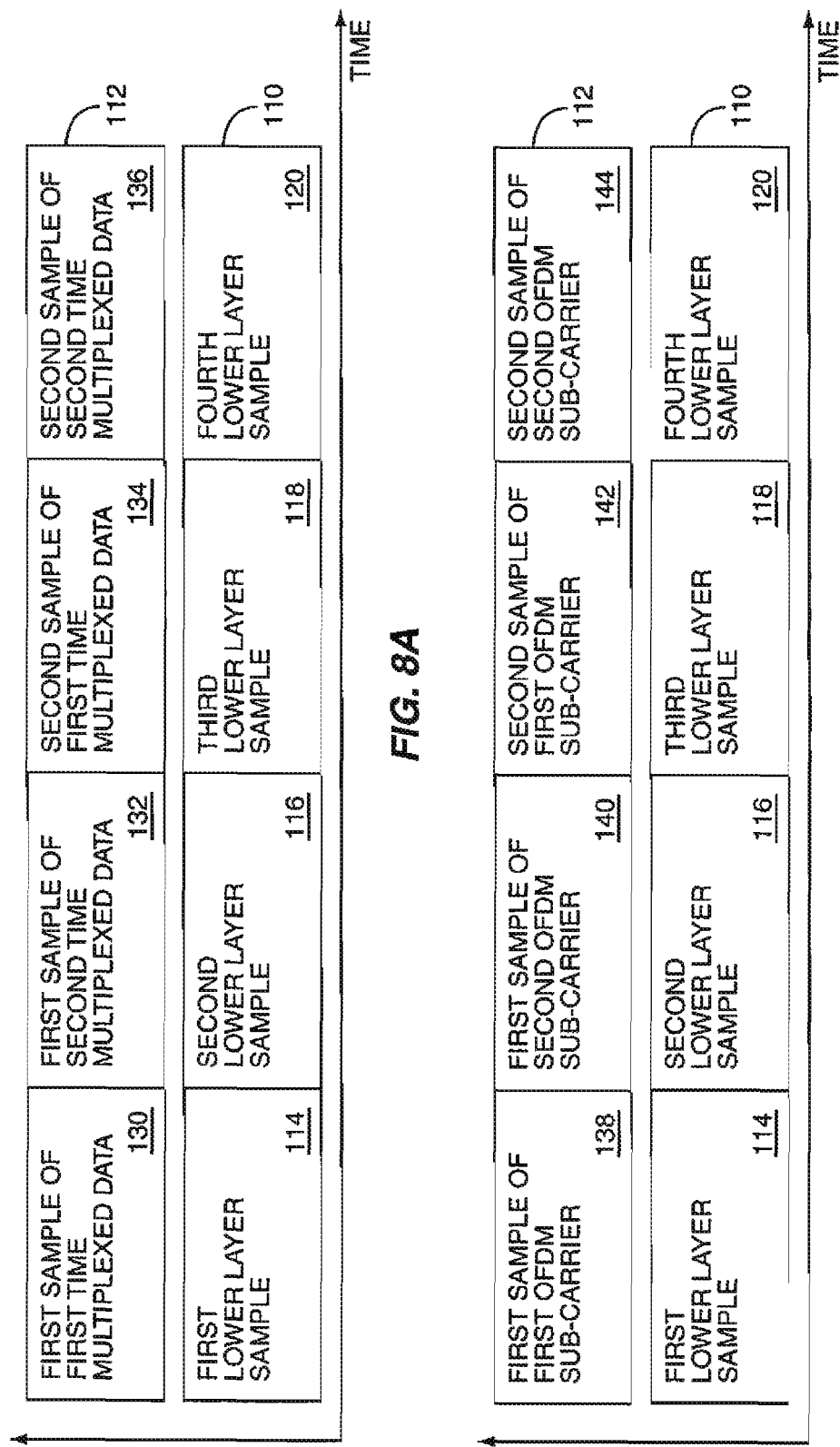
FIG. 8A shows time multiplexed data included in the higher modulation layer data.
FIG. 8B shows two single-frequency OFDM sub-carriers included in the higher modulation layer data.

FIG. 8A shows time multiplexed or TDM data included in the higher modulation layer data 112. The higher modulation layer data 112 includes a first sample of first time multiplexed data 130, a first sample of second time multiplexed data 132, a second sample of first time multiplexed data 134, and a second sample of second time multiplexed data 136. The samples 130, 134 of the first time multiplexed data are interspersed with the samples 132, 136 of the second time multiplexed data. Different channels, sub-channels, or unrelated data streams may be included in the higher modulation layer data 112. Other embodiments of the present invention may include TDM data in the higher modulation layer data 112, the lower modulation layer data 110, or both. The present invention may use two, three, four, or more modulation layers. TDM data may be associated with any or all of the modulation layers. The TDM data may be intended for one, two, three, or more user elements.

FIG. 8B shows two single-carrier orthogonal frequency division multiplexing (OFDM) sub-carriers included in the higher modulation layer data 112. The higher modulation layer data 112 includes a first sample of a first OFDM sub-carrier 138, a first sample of a second OFDM sub-carrier 140, a second sample of the first OFDM sub-carrier 142, and a second sample of the second OFDM sub-carrier 144. The samples 138, 142 of the first OFDM sub-carrier are interspersed with the samples 140, 144 of the second OFDM sub-carrier. Other embodiments of the present invention may include OFDM data in the higher modulation layer data 112, the lower modulation layer data 110, or both.

FIG. 9 adds MIMO antennas to the base stations and some of the terminals illustrated in FIG. 1. The first base station 12 includes a second antenna port ANT2 coupled to a first MIMO base station antenna 146. The second base station 16 includes a second antenna port ANT2 coupled to a second MIMO base station antenna 148. The first mobile terminal 20 includes a second antenna port ANT2 coupled to a first MIMO mobile terminal antenna 150. The fixed terminal 24 includes a second antenna port ANT2 coupled to a fixed MIMO antenna 152. The third mobile terminal 32 includes a second antenna port ANT2 coupled to a second MIMO mobile terminal antenna 154. The second mobile terminal 28 does not have a MIMO antenna. The RF communications system 10 illustrated in FIG. 9 may represent a communications system that has been upgraded to include MIMO capability. The second mobile terminal 28 does not have MIMO capability and may represent a previous generation UE, or may be a low cost, reduced functionality UE sold for use in the MIMO RF communications system 10. By using the present invention, the second mobile terminal 28 may be able to transmit and receive lower modulation layer data 110 to and from the base stations 12, 16, and the other terminals 20, 24, 32 may be able to transmit and receive both modulation layer data 110, 112 to and from the base stations 12, 16.

The present invention includes processing different information streams using different modulation layers, such as MIMO. MIMO systems use multiple antennas for each base station or terminal. The multiple antennas may provide spatial diversity, which allows spatial multiplexing. Spatial multiplexing may allow different information to be transmitted and received from each of the multiple antennas. Other systems may use multiple antennas for diversity. Data from single antenna systems, such as the RF communications system 10 illustrated in FIG. 1 is known as single input single output (SISO) data. Data from multiple antenna systems that has different information associated with each antenna, such as the RF communications system 10 illustrated in FIG. 9 is known as MIMO data. By using SISO data with the lower modulation layer data 110 and MIMO data with the higher modulation layer data 112, the RF communications system 10 may be backward compatible by supporting previous generation communications protocols and present communications protocols.

FIG. 10 shows SISO data included in the lower modulation layer data 110, and two MIMO sub-channels included in the higher modulation layer data 112. The lower modulation layer data 110 includes a first SISO data sample 156, a second SISO data sample 158, a third SISO data sample 160, and a fourth SISO data sample 162. The higher modulation layer data 112 includes a first sample of a first MIMO sub-channel 164, a first sample of a second MIMO sub-channel 166, a second sample of the first MIMO sub-channel 168, and a second sample of the second MIMO sub-channel 170. The samples 164, 168 of the first MIMO sub-channel are interspersed with the samples 166, 170 of the second MIMO sub-channel. Other embodiments of the present invention may include MIMO data in the higher modulation layer data 112, the lower modulation layer data 110, or both.

FIG. 11 shows one embodiment of the present invention used with MIMO transmitter circuitry 172. First transmit circuitry 174 receives both lower modulation layer data LML and first higher modulation layer data $HML_1$. The first transmit circuitry 174 provides a first modulated RF signal to a first power amplifier 176, which provides an amplified first modulated RF signal to the first antenna port ANT1. The first modulated RE signal is based on both the lower modulation layer data LML and the first higher modulation layer data $HML_1$. Second transmit circuitry 178 receives both the lower modulation layer data LML and second higher modulation layer data $HML_2$. The second transmit circuitry 178 provides a second modulated RF signal to a second power amplifier 180, which provides an amplified second modulated RF signal to the second antenna port ANT2. The second modulated RF signal is based on both the lower modulation layer data LML and the second higher modulation layer data $HML_2$. The lower modulation layer data LML is sent to both antenna ports ANT1, ANT2. The first higher modulation layer data $HML_1$ is sent to only the first antenna port ANT1. The second higher modulation layer data $HML_2$ is sent to only the second antenna port ANT2. In one embodiment of the present invention, the lower modulation layer data LML includes basic broadcast data, the first higher modulation layer data $HML_1$ includes first supplemental data, and the second higher modulation layer data $HML_2$ includes second supplemental data. The second mobile terminal 28 may receive the basic broadcast data, and the other terminals 20, 24, 32 may receive the basic broadcast data, the first supplemental data, and the second supplemental data. All of the modulation layer data LML, $HML_1$, $HML_2$ is transmitted simultaneously. Each of the first and second higher modulation layer data $HML_1$, $HML_2$ is a MIMO sub-channel. The RF communications system 10 may have multiple base stations such that each base station has multiple antennas providing MIMO capability. All of the base stations and antennas may be used to form an SFN using the same lower modulation layer data LML. The first and second higher modulation layer data $HML_1$, $HML_2$ may be transmitted from different base stations, or an antenna on one base station may transmit the first higher modulation layer data $HML_1$ and an antenna on a different base station may transmit the second higher modulation layer data $HML_2$.

FIG. 12 shows details of the first base station 12 illustrated in FIG. 1. The basic architecture of the first base station 12 may include a receiver front end 182, a radio frequency transmitter section 184, an antenna 186, a duplexer or switch 188, a baseband processor 190, a control system 192, and a frequency synthesizer 194. The receiver front end 182 receives information bearing radio frequency signals from one or more remote transmitters provided by other base stations, terminals, or other user element. A low noise amplifier (LNA) 196 amplifies the signal. A filter circuit 198 minimizes broadband interference in the received signal, while down conversion and digitization circuitry 200 down converts the filtered, received signal to an intermediate or baseband frequency signal, which is then digitized into one or more digital streams. The receiver front end 182 typically uses one or more mixing frequencies generated by the frequency synthesizer 194. The baseband processor 190 processes the digitized received signal to extract the information or data bits conveyed in the received signal. This processing typically comprises demodulation, decoding, and error correction operations. As such, the baseband processor 190 is generally implemented in one or more digital signal processors (DSPs).

On the transmit side, the baseband processor 190 receives digitized data, which may represent voice, data, or control information, from the control system 192, which it encodes for transmission. The encoded data is output to the transmitter 184, where it is used by a modulator 202 to modulate a carrier signal that is at a desired transmit frequency. Power amplifier circuitry 204 amplifies the modulated carrier signal to a level appropriate for transmission, and delivers the amplified and modulated carrier signal to the antenna 186 through the duplexer or switch 188.

The following description provides an overview of a wireless communication environment and the architecture of a base station, or like access point, and a mobile terminal, which may be used in an OFDM and MIMO environment.

With reference to FIG. 13, a base station controller (BSC) 206 controls wireless communications within multiple cells 208, which are served by corresponding base stations (BS) 210. In general, each base station 210 facilitates communications using OFDM with mobile terminals 212, which are within the cell 208 associated with the corresponding base station 210. The movement of the mobile terminals 212 in relation to the base stations 210 results in significant fluctuation in channel conditions. As illustrated, the base stations 210 and mobile terminals 212 may include multiple antennas to provide spatial diversity for communications.

A high level overview of the mobile terminals 212 and base stations 210 of the present invention is provided prior to delving into structural and functional details. With reference to FIG. 14, a base station 210 configured according to one embodiment of the present invention is illustrated. The base station 210 generally includes a control system 214, a baseband processor 216, transmit circuitry 218, receive circuitry 220, multiple antennas 222, and a network interface 224. The receive circuitry 220 receives radio frequency signals bearing information from one or more remote transmitters provided by mobile terminals 212 (illustrated in FIG. 15). Preferably, a low noise amplifier and a filter (not shown) cooperate to amplify and remove broadband interference from the signal for processing. Downconversion and digitization circuitry (not shown) will then downconvert the filtered, received signal to an intermediate or baseband frequency signal, which is then digitized into one or more digital streams.

The baseband processor 216 processes the digitized received signal to extract the information or data bits conveyed in the received signal. This processing typically comprises demodulation, decoding, and error correction operations. As such, the baseband processor 216 is generally implemented in one or more digital signal processors (DSPs) or application-specific integrated circuits (ASICs). The received information is then sent across a wireless network via the network interface 224 or transmitted to another mobile terminal 212 serviced by the base station 210.

On the transmit side, the baseband processor 216 receives digitized data, which may represent voice, data, or control information, from the network interface 224 under the control of the control system 214, and encodes the data for transmission. The encoded data is output to the transmit circuitry 218, where it is modulated by a carrier signal having a desired transmit frequency or frequencies. A power amplifier (not shown) will amplify the modulated carrier signal to a level appropriate for transmission, and deliver the modulated carrier signal to the antennas 222 through a matching network (not shown). Modulation and processing details are described in greater detail below.

With reference to FIG. 15, a mobile terminal 212 configured according to one embodiment of the present invention is illustrated. Similarly to the base station 210, the mobile terminal 212 will include a control system 226, a baseband processor 228, transmit circuitry 230, receive circuitry 232, multiple antennas 234, and user interface circuitry 236. The receive circuitry 232 receives radio frequency signals bearing information from one or more base stations 210. Preferably, a low noise amplifier and a filter (not shown) cooperate to amplify and remove broadband interference from the signal for processing. Downconversion and digitization circuitry (not shown) will then downconvert the filtered, received signal to an intermediate or baseband frequency signal, which is then digitized into one or more digital streams.

The baseband processor 228 processes the digitized received signal to extract the information or data bits conveyed in the received signal. This processing typically comprises demodulation, decoding, and error correction operations, as will be discussed on greater detail below. The baseband processor 228 is generally implemented in one or more digital signal processors (DSPs) and application specific integrated circuits (ASICs).

For transmission, the baseband processor 228 receives digitized data, which may represent voice, data, or control information, from the control system 226, which it encodes for transmission. The encoded data is output to the transmit circuitry 230, where it is used by a modulator to modulate a carrier signal that is at a desired transmit frequency or frequencies. A power amplifier (not shown) will amplify the modulated carrier signal to a level appropriate for transmission, and deliver the modulated carrier signal to the antennas 234 through a matching network (not shown). Various modulation and processing techniques available to those skilled in the art are applicable to the present invention.

In OFDM modulation, the transmission band is divided into multiple, orthogonal carrier waves. Each carrier wave is modulated according to the digital data to be transmitted. Because OFDM divides the transmission band into multiple carriers, the bandwidth per carrier decreases and the modulation time per carrier increases. Since the multiple carriers are transmitted in parallel, the transmission rate for the digital data, or symbols, on any given carrier is lower than when a single carrier is used.

OFDM modulation may require the performance of an Inverse Fast Fourier Transform (IFFT) on the information to be transmitted. For demodulation, the performance of a Fast Fourier Transform (FFT) on the received signal is required to recover the transmitted information. In practice, the IFFT and FFT are provided by digital signal processing carrying out an Inverse Discrete Fourier Transform (IDFT) and Discrete Fourier Transform (DFT), respectively. Accordingly, the characterizing feature of OFDM modulation is that orthogonal carrier waves are generated for multiple bands within a transmission channel. The modulated signals are digital signals having a relatively low transmission rate and capable of staying within their respective bands. The individual carrier waves are not modulated directly by the digital signals. Instead, all carrier waves are modulated at once by IFFT processing.

In one embodiment, OFDM is used for at least the downlink transmission from the base stations 210 to the mobile terminals 212. Each base station 210 is equipped with n transmit antennas 222, and each mobile terminal 212 is equipped with m receive antennas 234. Notably, the respective antennas can be used for reception and transmission using appropriate duplexers or switches and are so labeled only for clarity.

With reference to FIG. 16, a logical OFDM transmission architecture is provided according to one embodiment. Initially, the base station controller 206 may send channel quality indicator (CQI) information based on carrier-to-interference ratios (CIR) to the base station 210. Additionally, the base station controller 206 will send data to be transmitted to various mobile terminals 212 to the base station 210. The base station 210 may use the CQIs associated with the mobile terminals to schedule the data for transmission as well as select appropriate coding and modulation for transmitting the scheduled data. The CQIs may be directly from the mobile terminals 212 or determined at the base station 210 based on information provided by the mobile terminals 212. In either case, the CQI for each mobile terminal 212 is a function of the degree to which the channel amplitude (or response) varies across the OFDM frequency band.

Scheduled data 238, which is a stream of bits, is scrambled in a manner reducing the peak-to-average power ratio associated with the data using data scrambling logic 240. A cyclic redundancy check (CRC) for the scrambled data is determined and appended to the scrambled data using CRC adding logic 242. Next, channel coding is performed using channel encoder logic 244 to effectively add redundancy to the data to facilitate recovery and error correction at the mobile terminal 212. Again, the channel coding for a particular mobile terminal 212 is based on the CQI. The channel encoder logic 244 uses known Turbo encoding techniques in one embodiment. The encoded data is then processed by rate matching logic 246 to compensate for the data expansion associated with encoding.

Bit interleaver logic 248 systematically reorders the bits in the encoded data to minimize the loss of consecutive data bits. The resultant data bits are systematically mapped into corresponding symbols depending on the chosen baseband modulation by mapping logic 250. Preferably, Quadrature Amplitude Modulation (QAM) or Quadrature Phase Shift Key (QPSK) modulation is used. The degree of modulation is preferably chosen based on the CQI for the particular mobile terminal. The symbols may be systematically reordered to further bolster the immunity of the transmitted signal to periodic data loss caused by frequency selective fading using symbol interleaver logic 252.

At this point, groups of bits have been mapped into symbols representing locations in an amplitude and phase constellation. When spatial diversity is desired, blocks of symbols are then processed by space-time block code (STC) encoder logic 254, which modifies the symbols in a fashion making the transmitted signals more resistant to interference and more readily decoded at a mobile terminal 212. The STC encoder logic 254 will process the incoming symbols and provide n outputs corresponding to the number of transmit antennas 222 for the base station 210. The control system 214 and/or baseband processor 216 will provide a mapping control signal to control STC encoding. At this point, assume the symbols for the n outputs are representative of the data to be transmitted and capable of being recovered by the mobile terminal 212. See A. F. Naguib, N. Seshadri, and A. R. Calderbank, "Applications of space-time codes and interference suppression for high capacity and high data rate wireless systems," Thirty-Second Asilomar Conference on Signals, Systems & Computers, Volume 2, pp. 1803-1810, 1998, which is incorporated herein by reference in its entirety.

For the present example, assume the base station 210 has two antennas 222 (n=2) and the SIC encoder logic 254 provides two output streams of symbols. Accordingly, each of the symbol streams output by the STC encoder logic 254 is sent to a corresponding IFFT processor 256, illustrated separately for ease of understanding. Those skilled in the art will recognize that one or more processors may be used to provide such digital signal processing, alone or in combination with other processing described herein. The IFFT processors 256 will preferably operate on the respective symbols to provide an inverse Fourier Transform. The output of the IFFT processors 256 provides symbols in the time domain. The time domain symbols are grouped into frames, which are associated with a prefix by like insertion logic 258. Each of the resultant signals is up-converted in the digital domain to an intermediate frequency and converted to an analog signal via the corresponding digital up-conversion (DUC) and digital-to-analog (D/A) conversion circuitry 260. The resultant (analog) signals are then simultaneously modulated at the desired RF frequency, amplified, and transmitted via the RF circuitry 262 and antennas 222. Notably, pilot signals known by the intended mobile terminal 212 are scattered among the sub-carriers. The mobile terminal 212, which is discussed in detail below, will use the pilot signals for channel estimation.

Reference is now made to FIG. 17 to illustrate reception of the transmitted signals by a mobile terminal 212. Upon arrival of the transmitted signals at each of the antennas 234 of the mobile terminal 212, the respective signals are demodulated and amplified by corresponding RF circuitry 264. For the sake of conciseness and clarity, only one of the two receive paths is described and illustrated in detail Analog-to-digital (A/D) converter and down-conversion circuitry 266 digitizes and downconverts the analog signal for digital processing. The resultant digitized signal may be used by automatic gain control circuitry (AGC) 268 to control the gain of the amplifiers in the RF circuitry 264 based on the received signal level.

Initially, the digitized signal is provided to synchronization logic 270, which includes coarse synchronization logic 272, fine synchronization logic 274, and frequency offset and clock estimation logic 276. The coarse synchronization logic 272 buffers several OFDM symbols and calculates an autocorrelation between the two successive OFDM symbols. A resultant time index corresponding to the maximum of the correlation result determines a fine synchronization search window, which is used by fine synchronization logic 274 to determine a precise framing starting position based on the headers. The output of the fine synchronization logic 274 facilitates frame acquisition by frame alignment logic 278. Proper framing alignment is important so that subsequent FFT processing provides an accurate conversion from the time to the frequency domain. The fine synchronization algorithm is based on the correlation between the received pilot signals carried by the headers and a local copy of the known pilot data. Once frame alignment acquisition occurs, the prefix of the OFDM symbol is removed with prefix removal logic 280 and resultant samples are sent to frequency offset correction logic 282, which compensates for the system frequency offset caused by the unmatched local oscillators in the transmitter and the receiver. The synchronization logic 270 may include the frequency offset and clock estimation logic 276, which is based on the headers to help estimate such effects on the transmitted signal and provide those estimations to the correction logic 282 to properly process OFDM symbols.

At this point, the OFDM symbols in the time domain are ready for conversion to the frequency domain using FFT processing logic 284. The results are frequency domain symbols, which are sent to processing logic 286. The processing logic 286 extracts the scattered pilot signal using scattered pilot extraction logic 288, determines a channel estimate based on the extracted pilot signal using channel estimation logic 290, and provides channel responses for all sub-carriers using channel reconstruction logic 292. In order to determine a channel response for each of the sub-carriers, the pilot signal is essentially multiple pilot symbols that are scattered among the data symbols throughout the OFDM sub-carriers in a known pattern in both time and frequency. FIG. 18 illustrates an exemplary scattering of pilot symbols among available sub-carriers over a given time and frequency plot in an OFDM environment. Continuing with FIG. 17, the processing logic compares the received pilot symbols with the pilot symbols that are expected in certain sub-carriers at certain times to determine a channel response for the sub-carriers in which pilot symbols were transmitted. The results are interpolated to estimate a channel response for most, if not all, of the remaining sub-carriers for which pilot symbols were not provided. The actual and interpolated channel responses are used to estimate an overall channel response, which includes the channel responses for most, if not all, of the sub-carriers in the OFDM channel.

The frequency domain symbols and channel reconstruction information, which are derived from the channel responses for each receive path are provided to an STC decoder 294, which provides STC decoding on both received paths to recover the transmitted symbols. The channel reconstruction information provides equalization information to the STC decoder 294 sufficient to remove the effects of the transmission channel when processing the respective frequency domain symbols The recovered symbols are placed back in order using symbol de-interleaver logic 296, which corresponds to the symbol interleaver logic 252 of the transmitter. The de-interleaved symbols are then demodulated or de-mapped to a corresponding bitstream using de-mapping logic 298. The bits are then de-interleaved using bit de-interleaver logic 300, which corresponds to the bit interleaver logic 248 of the transmitter architecture. The de-interleaved bits are then processed by rate de-matching logic 302 and presented to channel decoder logic 304 to recover the initially scrambled data and the CRC checksum. Accordingly, CRC logic 306 removes the CRC checksum, checks the scrambled data in traditional fashion, and provides it to the de-scrambling logic 308 for de-scrambling using the known base station de-scrambling code to recover the originally transmitted data 310.

In parallel to recovering the data 310, a CQI, or at least information sufficient to create a CQI at the base station 210, is determined and transmitted to the base station 14. As noted above, the CQI in a preferred embodiment is a function of the carrier-to-interference ratio (CR), as well as the degree to which the channel response varies across the various sub-carriers in the OFDM frequency band. For this embodiment, the channel gain for each sub-carrier in the OFDM frequency band being used to transmit information are compared relative to one another to determine the degree to which the channel gain varies across the OFDM frequency band. Although numerous techniques are available to measure the degree of variation, one technique is to calculate the standard deviation of the channel gain for each sub-carrier throughout the OFDM frequency band being used to transmit data.

Continuing with FIG. 17, a relative variation measure may be determined by providing the channel response information from the channel estimation function 290 to a channel variation analysis function 312, which will determine the variation and channel response for each of the sub-carriers in the OFDM frequency band, and if standard deviation is used, calculate the standard deviation associated with the frequency response. As noted, channel gain is a preferred measure of the channel response for calculating a CQI 314. The channel gain may be quantified based on a relative amplitude of the channel frequency response in decibels (dB), and as such, the amplitude of the channel frequency response may be represented by $H_{dB}(k)$, which is a function of a sub-carrier index k, where k=1 ... $k_{MIN}$, ... $k_{MAX}$, ... $k_{FFT}$. Notably, $k_{FFT}$ is the number of sub-carriers in the entire OFDM frequency band, and the sub-carriers $k_{MIN}$ through $k_{MAX}$ represent the sub-carriers within the OFDM frequency band that are actually used to transmit data. Typically, a range of sub-carriers at either end of the range of sub-carriers are not used, in order to minimize interference with other transmissions. As such, the degree of variation of the amplitude of the channel response may be determined only for the range of sub-carriers being used to transmit data ($k_{MIN}$ through $k_{MAX}$). The standard deviation of the channel response across the usable range of sub-carriers is calculated as follows:

$$std = \sqrt{\frac{1}{N_u - 1} \sum_{k_{MIN}}^{k_{MAX}} (H_{dB}(k) - \overline{H}_{dB})^2}, \quad \text{Eq. 1}$$

where $N_u$ is the number of usable sub-carriers, $H_{db}(k)$ is the log amplitude of the channel frequency response, and $\overline{H}_{db}$ is the mean of the log amplitude of the channel response across the usable range of sub-carriers or a subset thereof.

In a multiple-input multiple-output (MIMO) system where there are multiple transmit and multiple receive antennas 222, 234 each link corresponding to transmit/receive antenna pairs will have a unique CQI. An aggregate CQI, or set of aggregate CQIs, may be required for the overall MIMO set of links. To determine the aggregate CQIs, the channel frequency response and CIR for each transmit and receive antenna pair is determined.

For multiple receive antennas 234, the multiple channel frequency responses are combined, to provide for the diversity achieved from the multiple receive antennas 234. This combining is an averaging of the power of the respective channel frequency responses across the OFDM frequency band. The channel variation measure is then determined across the combined channel frequency response. The CIR values for the respective multiple receive antennas 234 are combined by summing.

For multiple transmit antennas 222, the modification to the CQI will depend on the particular space time coding technique employed to reflect the method by which the transmit diversity is being achieved by the code and used by the system. Some schemes, such as transmit diversity, will require that the respective channel frequency responses from the multiple transmit antennas 222 be combined as described for the multiple receive antennas 234 by averaging the power of the channel frequency responses across the OFDM frequency band. The channel variation measure is made across the combined frequency response. Further, the CIR values for the multiple transmit antennas 222 are also combined. For other schemes, a separate CQI may be determined for each transmit antenna 222 and relayed back to the base station 210. The base station 210 may use the CQI per transmit antenna 222 to separately adapt the modulation and coding on the data transmitted on the respective transmit antennas 222.

Those skilled in the art will recognize improvements and modifications to the preferred embodiments of the present invention. AU such improvements and modifications are considered within the scope of the concepts disclosed herein and the claims that follow.

What is claimed is:

1. A system for receiving information at a network element, comprising:
   a front end operable to:
      receive a hierarchical modulated carrier radio frequency signal in a single carrier frequency division multiplexed (SC-FDM) signal, the signal comprising first data intended for the network element modulated using a first modulation layer and second data intended for another network element modulated using a second modulation layer; and
   a baseband processor operable to:
      recover the first data and the second data; and process the first data to provide received data for the network element.

2. The system of claim 1, wherein the baseband processor is operable to not process the second data to provide received data for the network element.

3. The system of claim 1, wherein the hierarchical modulated carrier radio frequency signal further comprises third data not intended for the network element modulated using the first modulation layer.

4. The system of claim 3, wherein the baseband processor is further operable to select the first data as received data intended for the network element.

5. The system of claim 3, wherein the baseband processor is operable to not process the third data to provide received data for the network element.

6. The system of claim 1, wherein the network element is a mobile terminal.

7. A system for transmitting information at a network element, the system comprising:
   at least one communication interface comprising a first antenna and a second antenna; and
   a control system associated with the at least one communication interface and operable to:
      receive a plurality of data, each of the plurality of data intended for transmission to a respective network element, the plurality of data comprising at least first data and second data;
      transmit the plurality of data using a plurality of modulation layers of a carrier signal such that each modulation layer is:
         a hierarchical modulation layer of the carrier signal; and
         associated with at least one of the plurality of data; and
      wherein the first data is transmitted using the first and second antennas and the second data is transmitted using only the first antenna.

8. The system of claim 7, wherein the carrier signal comprises a plurality of modulation symbols, such that each of the plurality of modulation symbols comprises a plurality of bits that provides the plurality of data.

9. The system of claim 7, wherein:
   the first and second data are intended for a first network element and a second network element respectively;
   the plurality of modulation layers comprises a first modulation layer and a second modulation layer; and
   the first data is associated with the first modulation layer and the second data is associated with the second modulation layer.

10. The system of claim 9, wherein:
    the carrier signal comprises a plurality of modulation symbols, such that each of certain of the plurality of modulation symbols comprises a plurality of bits that provides the plurality of data; and
    the plurality of bits comprises at least one first order bit associated with the first data and at least one second order bit associated with the second data.

11. The system of claim 10, wherein the at least one first order bit is of higher order than the at least one second order bit.

12. The system of claim 10, wherein the certain of the plurality of modulation symbols are quadrature amplitude modulation (QAM) symbols.

13. The system of claim 12, wherein the QAM symbols are associated with 16-QAM.

14. The system of claim 12, wherein the QAM symbols are associated with 64-QAM.

15. The system of claim 14, wherein each QAM symbol comprises:
    the at least one first order bit; the at least one second order bit; and
    at least one third order bit that provides third order data intended for transmission to a third network element.

16. The system of claim 12, wherein the controller is operable to map the at least one first order bit to the certain of the plurality of modulation symbols such that the at least one first order bit can be recovered using a phase shift keying (PSK) receiver.

17. The system of claim 9, wherein:
    the first data comprises one of a group consisting of first voice content, second voice content, first broadcast data, second broadcast data, broadcast data having national content, broadcast data having regional content, broadcast data having local content, unicast data, first unicast data, second unicast data, and at least one program channel for supplemental program service; and
    the second data comprises another of the group consisting of first voice content, second voice content, first broadcast data, second broadcast data, broadcast data having national content, broadcast data having regional content, broadcast data having local content, unicast data, first unicast data, second unicast data, and at least one program channel for supplemental program service.

18. The system of claim 9, wherein the first data is associated with a first cellular telephone call and the second data is associated with a second cellular telephone call.

19. The system of claim 9, wherein the controller is operable to assign the first data to the first modulation layer and the second data to the second modulation layer based on reliability criteria, the reliability criteria comprising at least one selected from a group consisting of signal strength, communications channel conditions, and priority of transfer of the first data and the second data.

20. The system of claim 7, wherein the network element is a base station.

21. A method for receiving information at a network element, comprising:
    receiving a hierarchical modulated carrier radio frequency signal in a single carrier frequency division multiplexed (SC-FDM) signal, the signal comprising first data intended for the network element modulated using a first modulation layer and second data intended for another network element modulated using a second modulation layer; and
    recovering the first data and the second data; and processing the first data to provide received data for the network element.

22. The method of claim 21, wherein the network element is operable to not process the second data to provide received data for the network element.

23. The method of claim 21, wherein the hierarchical modulated carrier radio frequency signal further comprises third data not intended for the network element modulated using the first modulation layer.

24. The method of claim 23, further comprising selecting the first data as received data intended for the network element.

25. The method of claim 23, wherein the network element is operable to not process the third data to provide received data for the network element.

26. The method of claim 21, wherein the network element is a mobile terminal.

27. A mobile terminal, comprising:
- wireless circuitry, wherein the wireless circuitry is configured to receive a hierarchical modulated carrier radio frequency signal in a single carrier frequency division multiplexed (SC-FDM) signal, the signal comprising first data intended for the mobile terminal modulated using a first modulation layer and second data intended for another network element modulated using a second modulation layer; and
- processing logic, wherein the processing logic is configured to:
  - recover the first data and the second data; and
  - process the first data to provide received data for the mobile terminal.

28. The mobile terminal of claim 27, wherein the processing logic is configured to not process the second data to provide received data for the mobile terminal.

29. The mobile terminal of claim 27, wherein the hierarchical modulated carrier radio frequency signal further comprises third data not intended for the mobile terminal modulated using the first modulation layer.

30. The mobile terminal of claim 29, wherein the processing logic is further configured to select the first data as received data intended for the mobile terminal.

31. The mobile terminal of claim 29, wherein the processing logic is configured to not process the third data to provide received data for the mobile terminal.

* * * * *